(12) United States Patent
Ai et al.

(10) Patent No.: US 12,300,701 B2
(45) Date of Patent: May 13, 2025

(54) ARRAY SUBSTRATE AND DISPLAY PANEL

(71) Applicant: Wuhan China Star Optoelectronics Technology Co., Ltd., Hubei (CN)

(72) Inventors: Fei Ai, Hubei (CN); Dewei Song, Hubei (CN); Chengzhi Luo, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/621,257

(22) PCT Filed: Dec. 9, 2021

(86) PCT No.: PCT/CN2021/136695
§ 371 (c)(1),
(2) Date: Dec. 21, 2021

(87) PCT Pub. No.: WO2023/097728
PCT Pub. Date: Jun. 8, 2023

(65) Prior Publication Data
US 2024/0038765 A1  Feb. 1, 2024

(30) Foreign Application Priority Data
Nov. 30, 2021  (CN) .......................... 202111450410.2

(51) Int. Cl.
*H01L 27/12* (2006.01)
*G02F 1/1362* (2006.01)

(52) U.S. Cl.
CPC .... *H01L 27/1218* (2013.01); *G02F 1/136227* (2013.01); *H01L 27/124* (2013.01)

(58) Field of Classification Search
CPC ............... H01L 27/1218; H01L 27/124; H01L 27/1248; H01L 27/1214; G02F 1/136227
See application file for complete search history.

(56) References Cited

U.S. PATENT DOCUMENTS 10,962,850 B1 *  3/2021  Yang .................. G02F 1/136209
2013/0162570 A1 *  6/2013  Shin ....................... G06F 3/0412
345/173

(Continued)

FOREIGN PATENT DOCUMENTS

| CN | 104808376 | 7/2015 |
|----|-----------|--------|
| CN | 106775108 | 5/2017 |

(Continued)

OTHER PUBLICATIONS

International Search Report and the Written Opinion Dated Jul. 1, 2022 From the International Searching Authority Re. Application No. PCT/CN2021/136695 and Its Translation Into English. (18 Pages).

(Continued)

*Primary Examiner* — Victor A Mandala

(57) ABSTRACT

An array substrate and a display panel are provided. The array substrate includes a substrate, an array layer, an inorganic insulation layer, a conductive electrode, a passivation layer, and a pixel electrode disposed in sequence. The array layer includes a source electrode and a drain electrode. A first via hole is defined in the array substrate. The first via hole penetrates the passivation layer and the inorganic insulation layer and exposes the drain electrode. The pixel electrode is connected to the drain electrode in the first via hole.

20 Claims, 15 Drawing Sheets

(56) References Cited

U.S. PATENT DOCUMENTS

| | | | |
|---|---|---|---|
| 2017/0222059 A1* | 8/2017 | Chen | H01L 27/1222 |
| 2018/0081470 A1* | 3/2018 | Li | G06F 3/0443 |
| 2018/0373080 A1* | 12/2018 | Zou | G02F 1/136227 |
| 2019/0064568 A1* | 2/2019 | Zheng | H01L 29/66757 |
| 2019/0079626 A1* | 3/2019 | Liu | H01L 29/78675 |
| 2019/0302554 A1* | 10/2019 | Chang | G02F 1/136227 |
| 2020/0117300 A1* | 4/2020 | Chen | G06F 3/0412 |
| 2020/0125201 A1* | 4/2020 | Chen | H01L 29/78675 |
| 2020/0185416 A1* | 6/2020 | Wu | H01L 29/78648 |
| 2020/0194529 A1* | 6/2020 | Lee | H01L 23/585 |
| 2021/0041733 A1* | 2/2021 | Ai | G02F 1/136209 |
| 2021/0098749 A1* | 4/2021 | Choi | H10K 71/70 |
| 2021/0191208 A1* | 6/2021 | Lee | G02F 1/134318 |
| 2021/0225891 A1 | 7/2021 | Xiao et al. | |
| 2021/0249445 A1* | 8/2021 | Suzuki | H01L 29/41733 |
| 2021/0303093 A1* | 9/2021 | Cao | G02F 1/133357 |
| 2022/0052198 A1* | 2/2022 | Song | H01L 29/66969 |
| 2023/0135065 A1* | 5/2023 | Suzuki | H01L 27/124 257/72 |
| 2023/0163136 A1* | 5/2023 | Xiao | H01L 29/78633 257/59 |

FOREIGN PATENT DOCUMENTS

| | | |
|---|---|---|
| CN | 107479284 | 12/2017 |
| CN | 108649036 | 10/2018 |
| CN | 109742088 | 5/2019 |
| CN | 109887885 | 6/2019 |
| CN | 110634804 | * 12/2019 |
| CN | 111403338 | 7/2020 |

OTHER PUBLICATIONS

Notification of Office Action and Search Report Dated Nov. 18, 2022 From the State Intellectual Property Office of the People's Republic of China Re. Application No. 202111450410.2 and Its Translation Into English. (16 Pages).

* cited by examiner

ARRAY SUBSTRATE AND DISPLAY PANEL

BACKGROUND OF INVENTION

Field of Invention

The present application relates to a field of display technology, and specifically to an array substrate and a display panel.

Description of Prior Art

Thin film transistor liquid crystal displays (TFT-LCDs) have advantages of low power consumption, high contrast, and space saving and have become mainstream display devices on the market. Compared to traditional amorphous silicon (a-Si) technology, low-temperature polycrystalline-silicon (LTPS) technology has higher carrier mobility and is widely used in production of small and medium-sized high-resolution TFT-LCDs and active matrix organic light-emitting diode (AMOLED) display panels, but production of corresponding TFT array substrate requires more photomasks, and production cycles of products are longer. Therefore, how to effectively reduce the production cycles of LTPS array substrates and increase production capacity and reduce costs to increase market competitiveness is focus of current panel industry. An effective way to improve the aforesaid problem is to develop a new type structure of LTPS array substrates to reduce a number of the photomasks required for production of array substrate.

In traditional LTPS array technology, a technology of using more than 10 masks is usually used, which brings higher cost.

SUMMARY OF INVENTION

The embodiments of the present application provide an array substrate and a display panel to solve the technical problem of a large number of photomasks used in the current LTPS array technology.

One embodiment of the present application provides an array substrate, including
a substrate;
an array layer disposed on a side of the substrate, wherein the array layer includes a source electrode and a drain electrode;
an inorganic insulation layer disposed on a side of the array layer away from the substrate;
a conductive electrode disposed on a side of the inorganic insulation layer away from the array layer;
a passivation layer disposed on a side of the conductive electrode away from the inorganic insulation layer; and
a pixel electrode disposed on a side of the passivation layer away from the conductive electrode,
wherein, a first via hole is defined in the array substrate, the first via hole penetrates the passivation layer and the inorganic insulation layer and exposes the drain electrode, and the pixel electrode is connected to the drain electrode in the first via hole.

Optionally, in some embodiments of the present application, the first via hole includes a first sub-via hole and a second sub-via hole communicated with the first sub-via hole, the first sub-via hole is located in the inorganic insulation layer and exposes the drain electrode, the second sub-via hole is located in the passivation layer, the pixel electrode contacts to a hole wall of the first sub-via hole and a hole wall of the second sub-via hole respectively.

Optionally, in some embodiments of the present application, the conductive electrode is multiplexed as a touch electrode, the array substrate further includes a touch wiring disposed in a same layer with the drain electrode and spaced apart from the drain electrode, the connection electrode is located on a side of the passivation layer away from the conductive electrode, and the touch electrode is connected to the touch wiring through the connection electrode.

Optionally, in some embodiments of the present application, an opening is defined in the touch electrode, the opening is disposed corresponding to the touch wiring, a second via hole is defined in the inorganic insulation layer, the second via hole exposes the touch wiring, a third via hole is defined in the passivation layer, the third via hole communicates with the opening and the second via hole, and the connection electrode is filled in the second via hole, the opening, and the third via hole and contacts to a lateral wall of the opening.

Optionally, in some embodiments of the present application, the third via hole exposes a surface of the touch electrode away from the substrate.

Optionally, in some embodiments of the present application, an opening is defined in the touch electrode, the opening is disposed corresponding to the touch wiring, the passivation layer is filled in the opening, a second via hole is defined in the inorganic insulation layer, a pore size of the second via hole is less than a pore size of the opening, the second via hole exposes the touch wiring, a third via hole and a fourth via hole spaced apart from each other are defined in the passivation layer, the third via hole communicates with the opening and the second via hole, the fourth via hole exposes the touch electrode, the connection electrode is filled in the second via hole, the third via hole, the fourth via hole, and a part of the opening, and a part of the connection electrode located in the opening is insulated from the touch electrode.

Optionally, in some embodiments of the present application, the second via hole and the third via hole are formed under one same photomask.

Optionally, in some embodiments of the present application, the connection electrode and the pixel electrode are in a same layer and are insulated from each other.

Optionally, in some embodiments of the present application, the array layer further includes:
an active layer disposed on the side of the substrate, wherein the active layer has a channel region;
a gate insulation layer disposed on a side of the active layer away from the substrate;
a gate electrode disposed on a side of the gate insulation layer away from the active layer; and
an interlayer dielectric layer disposed on a side of the gate electrode away from the gate insulation layer, wherein the interlayer dielectric layer is located on a side of the drain electrode away from the inorganic insulation layer, and
wherein a thickness of the active layer ranges from 30 nm to 45 nm.

Optionally, in some embodiments of the present application, the array layer further includes:
an active layer disposed on the side of the substrate, wherein the active layer has a channel region;
a gate insulation layer disposed on a side of the active layer away from the substrate;
a gate electrode disposed on a side of the gate insulation layer away from the active layer; and
an interlayer dielectric layer disposed on a side of the gate electrode away from the gate insulation layer, wherein the interlayer dielectric layer is located on a side of the drain electrode away from the inorganic insulation layer, and wherein a width of the channel region ranges from 1.5 µm to 2.5 µm.

Optionally, in some embodiments of the present application, the array substrate further includes a buffer layer, the buffer layer is disposed between the substrate and the array layer, and a surface of the buffer layer close to the substrate contacts to the substrate.

One embodiment of the present application further includes an array substrate, including;

a substrate;

an array layer disposed on a side of the substrate, wherein the array layer includes a source electrode and a drain electrode;

an inorganic insulation layer disposed on a side of the array layer away from the substrate;

a conductive electrode disposed on a side of the inorganic insulation layer away from the array layer;

a passivation layer disposed on a side of the conductive electrode away from the inorganic insulation layer; and a pixel electrode disposed on a side of the passivation layer away from the conductive electrode, wherein, a first via hole is defined in the array substrate, the first via hole penetrates the passivation layer and the inorganic insulation layer and exposes the drain electrode, the pixel electrode is connected to the drain electrode in the first via hole, the first via hole includes a first sub-via hole and a second sub-via hole communicated with the first sub-via hole, the first sub-via hole is located in the inorganic insulation layer and exposes the drain electrode, the second sub-via hole is located in the passivation layer, the pixel electrode contacts to a hole wall of the first sub-via hole and a hole wall of the second sub-via hole respectively, and the first sub-via hole and the second sub-via hole are formed under one same photomask.

One embodiment of the present application further provides a display panel. The display panel includes an array substrate and a color film substrate disposed opposite to each other, and a liquid crystal layer disposed between the array substrate and the color film substrate. The array substrate includes a substrate;

an array layer disposed on a side of the substrate, wherein the array layer includes a source electrode and a drain electrode;

an inorganic insulation layer disposed on a side of the array layer away from the substrate;

a conductive electrode disposed on a side of the inorganic insulation layer away from the array layer;

a passivation layer disposed on a side of the conductive electrode away from the inorganic insulation layer; and a pixel electrode disposed on a side of the passivation layer away from the conductive electrode, wherein, a first via hole is defined in the array substrate, the first via hole penetrates the passivation layer and the inorganic insulation layer and exposes the drain electrode, and the pixel electrode is connected to the drain electrode in the first via hole.

Optionally, in some embodiments of the present application, the first via hole includes a first sub-via hole and a second sub-via hole communicated with the first sub-via hole, the first sub-via hole is located in the inorganic insulation layer and exposes the drain electrode, the second sub-via hole is located in the passivation layer, and the pixel electrode contacts to a hole wall of the first sub-via hole and a hole wall of the second sub-via hole respectively.

Optionally, in some embodiments of the present application, the conductive electrode is multiplexed as a touch electrode, the array substrate further includes a touch wiring disposed in a same layer with the drain electrode and spaced apart from the drain electrode, the connection electrode is located on a side of the passivation layer away from the conductive electrode, and the touch electrode is connected to the touch wiring through the connection electrode.

Optionally, in some embodiments of the present application, an opening is defined in the touch electrode, the opening is disposed corresponding to the touch wiring, a second via hole is defined in the inorganic insulation layer, the second via hole exposes the touch wiring, a third via hole is defined in the passivation layer, the third via hole communicates with the opening and the second via hole, and the connection electrode is filled in the second via hole, the opening, and the third via hole and contacts to a lateral wall of the opening.

Optionally, in some embodiments of the present application, the third via hole exposes a surface of the touch electrode away from the substrate.

Optionally, in some embodiments of the present application, an opening is defined in the touch electrode, the opening is disposed corresponding to the touch wiring, the passivation layer is filled in the opening, a second via hole is defined in the inorganic insulation layer, a pore size of the second via hole is less than a pore size of the opening, the second via hole exposes the touch wiring, a third via hole and a fourth via hole spaced apart from each other are defined in the passivation layer, the third via hole communicates with the opening and the second via hole, and the fourth via hole exposes the touch electrode, the connection electrode is filled in the second via hole, the third via hole, the fourth via hole, and a part of the opening, and a part of the connection electrode located in the opening is insulated from the touch electrode.

Optionally, in some embodiments of the present application, the second via hole and the third via hole are formed under one same photomask.

Optionally, in some embodiments of the present application, the array substrate further includes a buffer layer, the buffer layer is disposed between the substrate and the array layer, and a surface of the buffer layer close to the substrate contacts to the substrate.

Compared to the array substrate in the prior art, in the array substrate provided by the present application, by disposing the inorganic insulation layer between the array layer and the conductive electrode, the inorganic insulation layer is used to replace a planarized organic layer in a traditional array structure. Because the passivation layer is also an inorganic film layer, in manufacturing processes of the array substrates, openings can be defined in the passivation layer and the inorganic insulation layer by one same mask to form a first via hole connecting the pixel electrode and the drain electrode. Therefore, requirement of separately defining an opening for the planarized organic layer in the traditional manufacturing process is omitted, which reduces a number of photomasks used in the manufacturing processes of the array substrate.

DESCRIPTION OF DRAWINGS

To more clearly illustrate the technical solutions of the embodiments of the present application, the accompanying figures of the present application will be described in brief. Obviously, the accompanying figures described below are only part of the embodiments of the present application, from which figures those skilled in the art can derive further figures without making any inventive efforts.

DETAILED DESCRIPTION OF EMBODIMENTS

Figure 1:
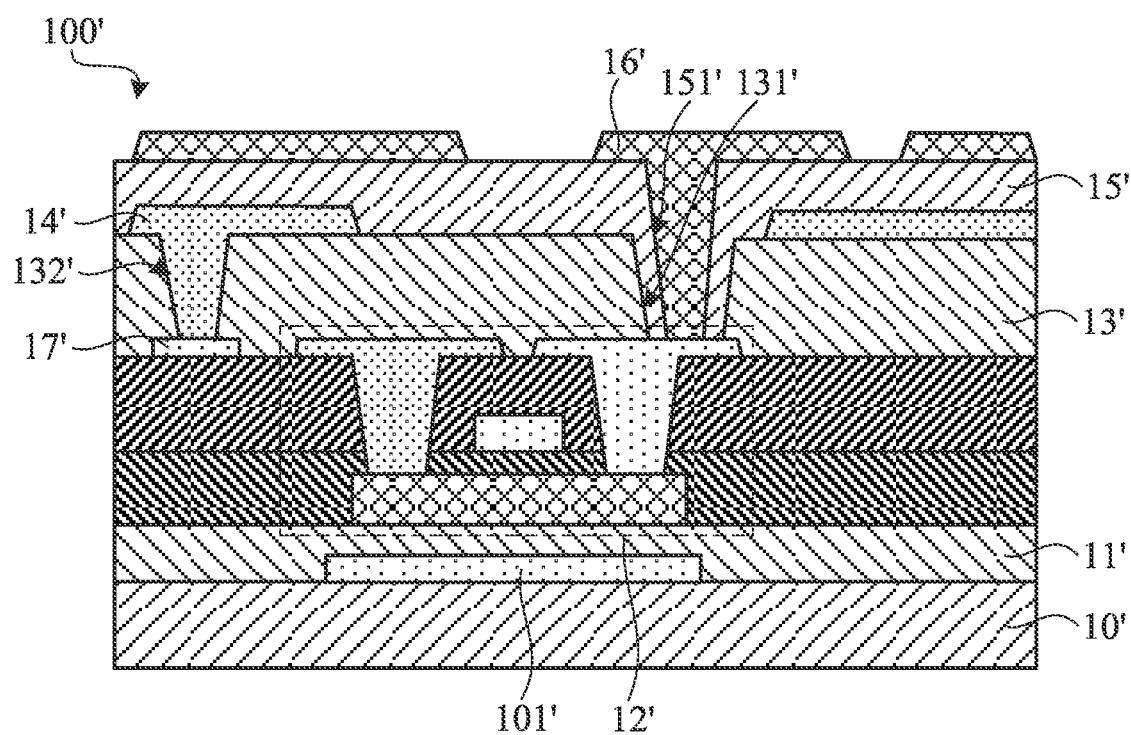
FIG. 1 is a structural schematic diagram of an array substrate in the prior art.

The technical solutions in the embodiments of the present application are clearly and completely described in the following with reference to the accompanying drawings in the embodiments of the present application. Obviously, the described embodiments are only part of the embodiments of the present application, but are not all embodiments of the present application. All other embodiments obtained from those skilled in the art based on the embodiments of the present application without creative efforts are within the scope of the present application. Besides, it should be understood that the specific embodiments described herein are merely for describing and explaining the present application and are not intended to limit the present application. In the present application, unless opposite stated, the orientation words used such as "upper" and "lower" generally refer to the upper and lower directions of the device in actual using or working state, and specifically refer to the drawing directions in the drawings, and "inner" and "outer" refer to the outline of the device.

The embodiments of the present application provide an array substrate and a display panel. The details are described below respectively. It should be noted that a description order of the following embodiments is not intended to limit a preferred order of the embodiments.

As illustrated in FIG. 1, an array substrate 100' in the prior art includes a substrate 10', a light shielding layer 101', a buffer layer 11', an array layer 12', a planarized organic layer 13', a touch electrode 14', a passivation layer 15', and a pixel electrode 16' disposed in sequence. A first opening 131' exposing a drain electrode (not shown is the figure) is defined in the planarized organic layer 13'. A second opening 151' is defined in the passivation layer 15'. The first opening 131' is sleeved on an outer side of the second opening 151'. The pixel electrode 16' is electrically connected to a drain electrode through the second opening 151'. The array substrate 100' further includes a touch wiring 17'. The touch wiring 17' and the drain electrode are disposed on a same layer. A third opening 132' is further defined in the planarized organic layer 13'. The touch electrode 14' is electrically connected to the touch wiring 17' through the third opening 132'.

However, as the planarized organic layer 13' is an organic film layer, and the passivation layer 15' is an inorganic film layer, the first opening 131' in the planarized organic layer 13' and the second 151' in the passivation layer 15' each need a photomask to be formed. Specifically, after one photomask is used to define the first opening 131' exposing the drain electrode in the planarized organic layer 13', due to limitation of the process, a pore size of the second opening 151' can be smaller than a pore size of the first opening 131' another, when another photomask is used to define the second opening 151' in the passivation layer 15'. Therefore, in the first opening 131', a nested structure of the first opening 131' sleeved on the outer side of the second opening 151' is formed. In summary, in the processes of the aforesaid display panel 100', because two photomasks are required to form structures of via holes for electrically connecting the pixel electrode 16' and the drain electrode, a total number of photomasks used in the manufacturing processes of the array substrate 100' can be increased.

Aiming at the aforesaid technical problems existing in the prior art, the present application provides an array substrate, including a substrate, an array layer, an inorganic insulation layer, a conductive electrode, a passivation layer, and a pixel electrode. The is array layer disposed on a side of the substrate. The array layer includes a source electrode and a drain electrode. The inorganic insulation layer is disposed on a side of the array layer away from the substrate. The conductive electrode is disposed on a side of the inorganic insulation layer away from the array layer. The passivation layer is disposed on a side of the conductive electrode away from the inorganic insulation layer. The pixel electrode is disposed on a side of the passivation layer away from the conductive electrode. Wherein, a first via hole is defined in the array substrate, the first via hole penetrates the passivation layer and the inorganic insulation layer and exposes the drain electrode, and the pixel electrode is connected to the drain electrode in the first via hole.

Thus, in the array substrate provided by the present application, by disposing the inorganic insulation layer between the array layer and the conductive electrode, the inorganic insulation layer is used to replace the planarized organic layer in the traditional array structure. Because the passivation layer is also an inorganic film layer, in manufacturing processes of the array substrates, openings can be defined in the passivation layer and the inorganic insulation layer by one same mask to form a first via hole connecting the pixel electrode and the drain electrode. Therefore, requirement of separately defining an opening for the planarized organic layer in the traditional manufacturing process is omitted, which reduces a number of photomasks used in the manufacturing processes of the array substrate.

Figure 2:
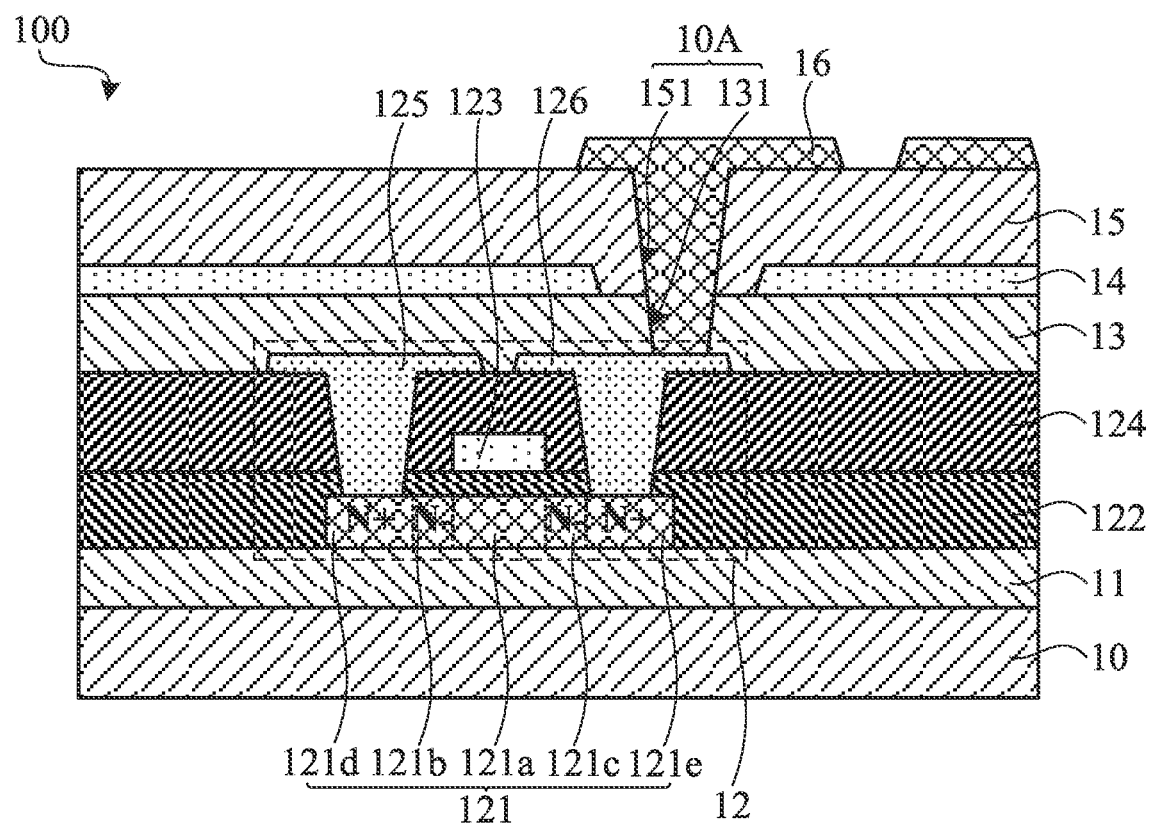
FIG. 2 is a structural schematic diagram of an array substrate provided by a first embodiment of the present application.

Please refer to FIG. 2. An array substrate 100 provided by a first embodiment of the present application includes a substrate 10, a buffer layer 11, an array substrate 12, an inorganic insulation layer 13, a conductive electrode 14, a passivation layer 15, and a pixel electrode 16.

Specifically, the substrate 10 can be a rigid substrate, such as a glass substrate, or the substrate 10 can also be a flexible substrate, such as a polyimide substrate. A material of the substrate 10 is not specifically limited in the present application.

The buffer layer 11 is disposed on a side of the substrate. A surface of the buffer layer 11 close to the substrate 10 contacts to the substrate 10. A material of the buffer layer 11 can include one or more of silica, silicon nitride, or silicon oxynitride.

The array layer 12 is disposed on a side of the buffer layer 11 away from the substrate 10. The array layer 12 includes an active layer 121, a gate insulation layer 122, a gate electrode 123, an interlayer dielectric layer 124, a source electrode 125, and a drain electrode 126.

Wherein, the active layer 121 is disposed on a side of the buffer layer 11 away from the substrate 10. A material of the active layer 121 includes low-temperature polycrystalline-silicon. Specifically, the active layer 121 has a channel region 121a, a first lightly doped region 121b, a second lightly doped region 121c, a first heavily doped region 121d, and a second heavily doped region 121e. The first lightly doped region 121b and the second lightly doped region 121c are located on two opposite sides of the channel region 121a. The first heavily doped region 121d is located on a side of the first lightly doped region 121b away from channel region 121a. The second heavily doped region 121e is located on a side of the second lightly doped region 121c away from the channel region 121a.

Specifically, the first lightly doped region 121b and the second lightly doped region 121c are formed by lightly doping the active layer 121 with ions. The first heavily doped region 121d and the second heavily doped region 121e are formed by heavily doping the active layer 121 with ions. Taking an N-metal-oxide-semiconductor (NMOS) type low temperature poly-silicon (LTPS) thin film transistor (TFT) substrate as an example, the heavy ion doping and the light ion doping are both N-type ion doping, and the doped ions are phosphorus (P) ions or other N-type element ions. Similarly, taking an P-metal-oxide-semiconductor (PMOS) LTPS TFT substrate as an example, the heavy ion doping and the light ion doping are both P-type ion doping, and the doped ions are boron (B) ions or other P-type element ions.

The gate insulation layer 122 is disposed on a side of the active layer 121 away from the buffer layer 11. A material of the gate insulation layer 122 can include one or more of silica, silicon nitride, or silicon oxynitride.

The gate electrode 123 is disposed on a side of the gate insulation layer 122 away from the active layer 121. The gate electrode 123 and the channel region 121a are disposed correspondingly. Specifically, an orthogonal projection of the gate electrode 123 on a plane where the substrate 10 is covers an orthogonal projection of the channel region 121a on the plane where the substrate 10 is. Wherein, a material of the gate electrode 123 can include one or more of copper, aluminum, molybdenum, or titanium.

The interlayer dielectric layer 124 is disposed on a side of the gate electrode 123 away from the gate insulation layer 122. The interlayer dielectric layer 124 is located on a side of the drain electrode 126 away from the inorganic insulation layer 13. Wherein, a material of the interlayer dielectric layer 124 can include one or more of silica, silicon nitride, or silicon oxynitride.

The source electrode 125 and the drain electrode 126 are disposed on a side of the interlayer dielectric layer 124 away from the gate electrode 123. Wherein, the source electrode 125 partially contacts to a part of the active layer 121 located in the first heavily doped region 121d. The drain electrode 126 contacts to a part of the active layer 121 located in the second heavily doped region 121e. Materials of the source electrode 125 and the drain electrode 126 are same and can both include one or more of copper, aluminum, molybdenum, or titanium.

The inorganic insulation layer 13 is disposed on a side of the array layer 12 away from the interlayer dielectric layer 124. A material of the inorganic insulation layer 13 can include one or more of silica, silicon nitride, or silicon oxynitride. In this embodiment, a thickness of the inorganic insulation layer 13 ranges from 100 nm to 1000 nm, such as 100 nm, 200 nm, 500 nm, 600 nm, 700 nm、800 nm, 900 nm, or 1000 nm. Wherein, the inorganic insulation layer 13 can be a single-layer structure, a double-layer structure, or a multi-layer structure. In this embodiment, the inorganic insulation layer 13 being the single-layer structure is taken as an example for description, but it is not limited to thereto.

The conductive electrode 14 is disposed on a side of the inorganic insulation layer 13 away from the array layer 12. In this embodiment, the conductive electrode 14 is disposed in an entire surface manner. Wherein, the conductive electrode 14 can be a common electrode. A material of the conductive electrode 14 can include a transparent conductive material such as indium tin oxide, etc.

The passivation layer 15 is disposed on a side of the conductive electrode 14 away from the inorganic insulation layer 13. A material of the passivation layer 15 can include one or more of silica, silicon nitride, or silicon oxynitride.

The pixel electrode 16 is disposed on a side of the passivation layer 15 away from the conductive electrode 14. A material of the pixel electrode 16 can include a transparent conductive material such as indium tin oxide, etc.

In this embodiment, a first via hole 10A is defined in the array substrate 100. The first via hole 10A penetrates the passivation layer 15 and the inorganic insulation layer 13 and exposes the drain electrode 126. The pixel electrode 16 is connected to the drain electrode 126 in the first via hole 10A.

Specifically, the first via hole 10A includes a first sub-via hole 131 and a second sub-via hole 151 communicated with the first sub-via hole 131. Wherein, the first sub-via hole 131 is located in the inorganic insulation layer 13 and exposes the drain electrode 126. The second sub-via hole 151 is located in the passivation layer 15.

In this embodiment, the first sub-via hole 131 and the second sub-via hole 151 are formed under one same photomask. Thus, in this embodiment, the inorganic insulation layer 13 is used to replace the planarized organic layer in the traditional array structure. Because the passivation layer 15 is also the inorganic film layer, the first sub-via hole 131 in the inorganic insulation layer 13 and the second sub-via hole 151 in the passivation layer 15 can be formed under one same photomask to realize connection of the pixel electrode 16 and the drain electrode 126. Therefore, one photomask required for defining an opening of the planarized organic layer in the traditional manufacturing processes is omitted, a number of the photomasks used in the manufacturing process of the array substrate 100 is reduced, and production cycle of the array substrate 100 is effectively reduced, which increase production capacity, reduces the process cost, and improves market competitiveness of display products.

Furthermore, in this embodiment, a thickness of the active layer 121 ranges from 30 nm to 45 nm. A width of the channel region 121a ranges from 1.5 μm to 2.5 μm.

In a traditional design, a light-shielding layer is generally disposed on a side of the active layer 121 close to the substrate 10 to block the environmental light to ensure that the thin film transistor has a low photo-generated leakage current. However, because the aforesaid configuration requires the additional patterned light-shielding layer, it is necessary to add one photomask on the basis of original manufacturing processes, thereby increasing the number of the photomasks used in the manufacturing processes of the array substrate 100.

Aiming at the aforesaid technical problem, because the surface of the buffer layer 11 close to the substrate 10 in the present application directly contacts to the substrate 10, i.e., configuration of the light-shielding layer is omitted in the present application, thereby reducing the number of the photomasks used in the array manufacturing processes. Furthermore, the inventor of the present application found in experimental exploration that the photo-generated leakage current of the thin film transistor is positively correlated with the thickness of the active layer 121 and the width of the channel region 121a. In a traditional design, in order to ensure the driving performance of the thin film transistor, the thickness of the active layer 121 is generally configured above 45 nm, and the width of the channel region 121a is configured above 2.5 μm. Regarding this, in order to prevent from increasing the photo-generated leakage current of the thin film transistor due to omission of the light-shielding layer, the thickness of the active layer 121 is configured at 30 nm-45 nm, and the width of the channel region 121a is configured at 1.5 μm-2.5 μm in this embodiment. In the aforesaid range, the photo-generated leakage current of the thin film transistor can be significantly reduced.

In some specific embodiments, the thickness of the active layer 121 can be 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, or 45 nm. The width of the channel region 121a can be 1.5 μm, 1.6 μm, 1.7 μm, 1.8 μm, 1.9 μm, 2.0 μm, 2.1 μm, 2.2 μm, 2.3 μm, 2.4 μm, or 2.5 μm.

Please refer to table 1. Table 1 shows values of the photo-generated leakage current of the thin film transistor under different thicknesses of the active layer 121 and widths of the channel region 121a.

TABLE 1

|  | Example 1 | Example 2 | Example 3 | Example 4 | Example 5 |
|---|---|---|---|---|---|
| thickness of active layer121/nm | 45 | 40 | 35 | 45 | 45 |
| Width of channel region 121a/μm | 2.5 | 2.5 | 2.5 | 2 | 1.8 |
| photo-generated leakage current | 4.56E−12 | 3.01E−12 | 2.39E−12 | 3.20E−12 | 2.91E−12 |

It can be understood from table 1 that when the thickness of the active layer 121 remains unchanged, for example, when the thickness of the active layer 121 is 45 nm, by reducing the width of the channel region 121a, the values of the photo-generated leakage current is significantly reduced; and when the width of the channel region 121a remains unchanged, for example, when the width of the channel region 121a is 2.5 μm, by reducing the thickness of the active layer 121, the values of the photo-generated leakage current are significantly reduced. Therefore, in this embodiment, by configuring the thickness of the active layer 121 at 30 nm-45 nm and the width of the channel region 121a at 1.5 μm-2.5 μm, defect due to increment of the photo-generated leakage current caused by the omission of the light shielding layer can be compensated. Thus, under premise of ensuring driving performance of the thin film transistor, the number of the photomasks used in the manufacturing process of the array substrate 100 is reduced, and the process cost is reduced.

In some embodiments, the thickness of the active layer 121 can also be configured at 30 nm-45 nm, and the width of the channel region 121a can also be configured at more than 2.5 μm; or the thickness of the active layer 121 can also be configured at 1.5 μm-2.5 μm, and the width of the channel region 121a can also be configured at more than 45 nm. The aforesaid configuration can also achieve the effect of reducing the photomasks and reducing the photo-generated leakage current of the thin film transistor.

Figure 3:
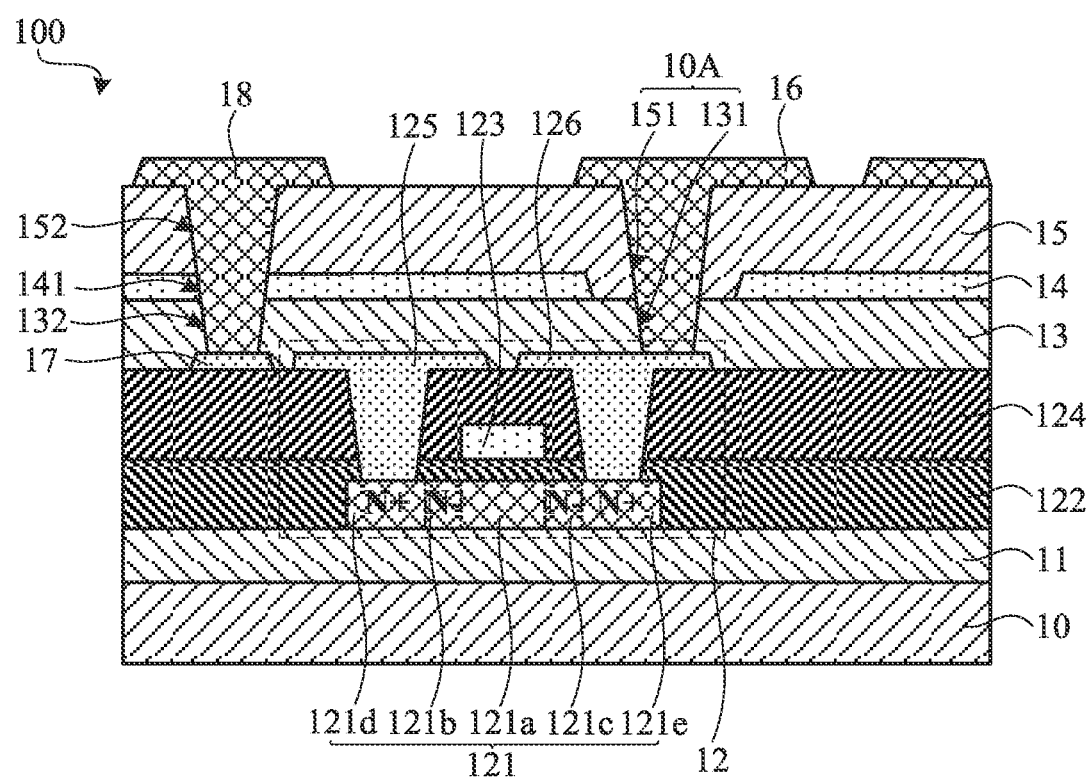
FIG. 3 is a structural schematic diagram of the array substrate provided by a second embodiment of the present application.

Please refer to FIG. 3, a second embodiment of the present application provides an array substrate 100. The difference between the array substrate 100 provided by the second embodiment of the present application and the first embodiment is that when the array substrate 100 has a touch function, the conductive electrodes 14 can be multiplexed as a touch electrode. The array substrate 100 further includes a touch wiring 17 and a connection electrode 18. The touch wiring 17 and the drain electrode 126 are disposed on a same layer and are spaced apart with each other. A second via hole 132 is defined in the inorganic insulation layer 13. The second via hole 132 exposes the touch wiring 17. An opening 141 is defined in the touch electrode 14. The opening 141 is disposed corresponding to the touch wiring 17. A third via hole 152 is defined in the passivation layer 15. The third via hole 152 communicates with the opening 141 and the second via hole 132. The connection electrode 18 is located on a side of the passivation layer 15 away from the conductive electrode 14 and is insulated from the pixel electrode 16. The connection electrode 18 is filled in the second via hole 132, the opening 141, and the third via hole 152 and contacts to a lateral wall of the opening 141. The touch electrode is electrically connected to the touch wiring 17 through the conductive electrode 14.

Wherein, the second via hole 132 and the third via hole 152 are formed under one same photomask. In this embodiment, the inorganic insulation layer 13 is used to replace the planarized organic layer in the traditional array structure. Because the passivation layer 15 is also an inorganic film layer, when manufacturing the array substrate 100 with an in-cell touch function is needed, the second via hole 132 in the inorganic insulation layer 13 and the third via hole 152 in the passivation layer 15 can be formed under one photomask, and the conduction between the touch wiring 17 and the touch electrode is realized through the connection of the connection electrode 18.

It should be noted that the conductive electrodes 14 being multiplexed as touch electrode in this embodiment means that when a touch operation needs to be performed, the conductive electrodes 14 can be used as a touch electrode. In addition, when the touch operation is not needed to perform, the conductive electrode 14 can act as a common electrode to form a storage capacitor with the pixel electrode 16. The related technology can refer to the technology of prior art, and redundant description will not be mentioned herein.

Specifically, in this embodiment, the touch wiring 17 is disposed on a side of the source electrode 125 away from the drain electrode 126. The touch wiring 17, the source electrode 125, and the drain electrode 126 can be obtained by one same photomask. It should be noted that in some embodiments, The touch wiring 17 can also be disposed on a side of the drain electrode 126 away from the source electrode 125. The position of the touch wiring 17 is not specifically limited by this embodiment.

Wherein, an orthogonal projection of the touch wiring 17 located on a plane where the touch electrode is located is at least partially located in the opening 141 to make the touch electrode can connect to the touch wiring 17 through the connection electrode 18.

In this embodiment, the connection electrode 18 and the pixel electrode 16 are disposed on a same layer. Specifically, the connection electrode 18 and the pixel electrode 16 can be obtained by one same photomask. Therefore, in this embodiment, the connection electrode 18 can be formed on the basis of original processes, and manufacturing cost of the processes is not increased. In addition, in some embodiments, the connection electrode 18 and the pixel electrode 16 can be disposed on different layers, redundant description will not be mentioned herein.

Figure 4:
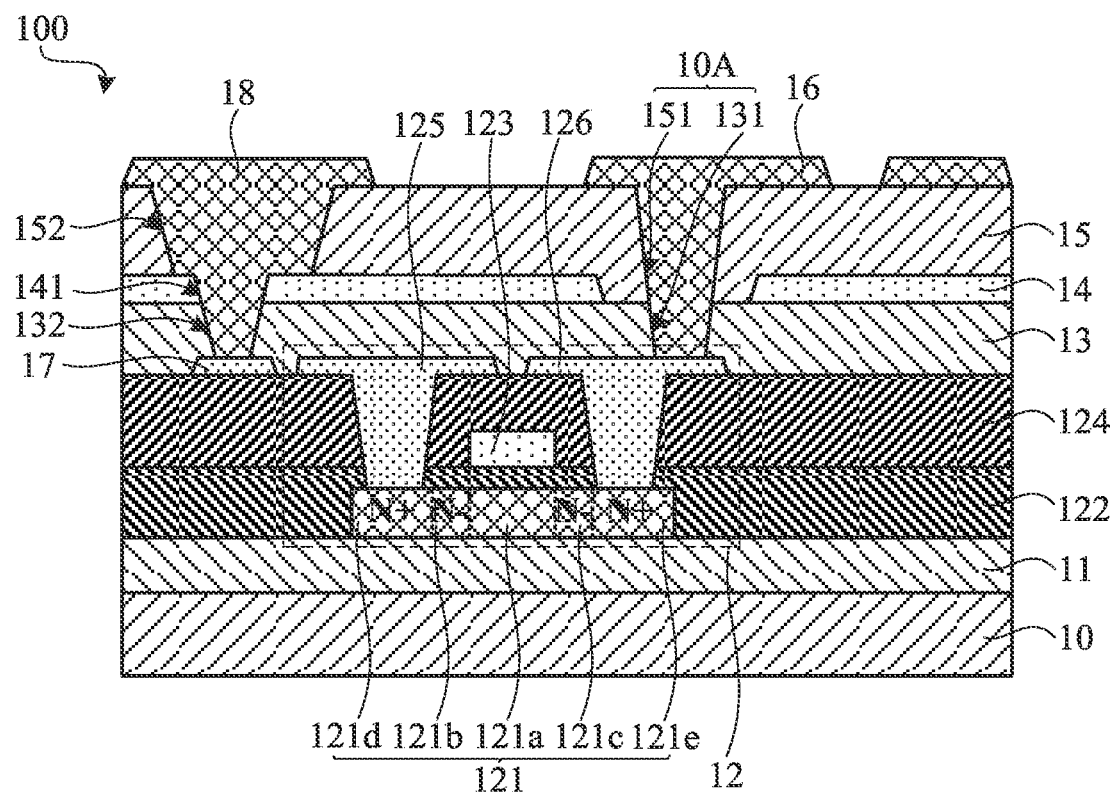
FIG. 4 is a structural schematic diagram of the array substrate provided by a third embodiment of the present application.

Please refer to FIG. 4, a third embodiment of the present application provides an array substrate 100. The difference between the array substrate 100 provided by the third embodiment of the present application and the second embodiment is that the third via hole 152 exposes a surface of the touch electrode away from the substrate 10.

In this embodiment, a pore size of the third via hole 152 is greater than a pore size of the opening 141 to expose the surface of the touch electrode, so that the connection electrode 18 can contact to an upper surface of the touch electrode. Therefore, a contact area of the connection electrode 18 and the touch electrode is increased, which is beneficial to improve conduction effect of the touch electrode and the touch trace 17 and improves the touch sensitivity.

Figure 5:
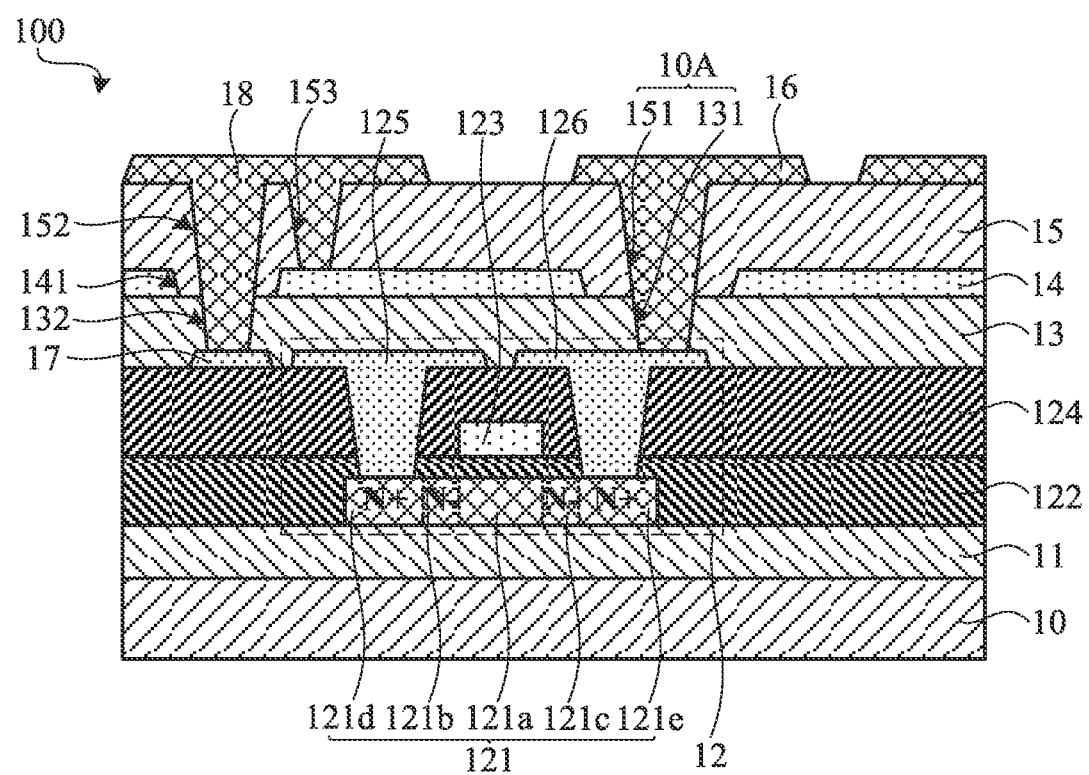
FIG. 5 is a structural schematic diagram of the array substrate provided by a fourth embodiment of the present application.

Please refer to FIG. 5, a fourth embodiment of the present application provides an array substrate 100. The difference between the array substrate 100 provided by the fourth embodiment of the present application and the third embodiment is that the passivation layer 15 is filled in the opening 141. A pore size of the second via hole 132 is less than a pore size of the opening 141. A fourth via hole 153 is defined in the passivation layer 15. The fourth via hole 153 and the third via hole 152 are spaced apart with each other. The fourth via hole 153 exposes the touch electrode. The connection electrode 18 is filled in the second via hole 132, the third via hole 152, the fourth via hole 153, and a part of the opening 141. A part of the connection electrode 18 located in the opening 141 is insulated from the touch electrode.

In this embodiment, by adding the fourth via hole 153 in the passivation layer 15, connection electrode 18 can realize conduction of the touch electrode and the touch wiring 17 through the second via hole 132, the third via hole 152, and the fourth via hole 153. Therefore, the conduction effect can be increased, and touch sensitivity can be further improved.

Figure 6:
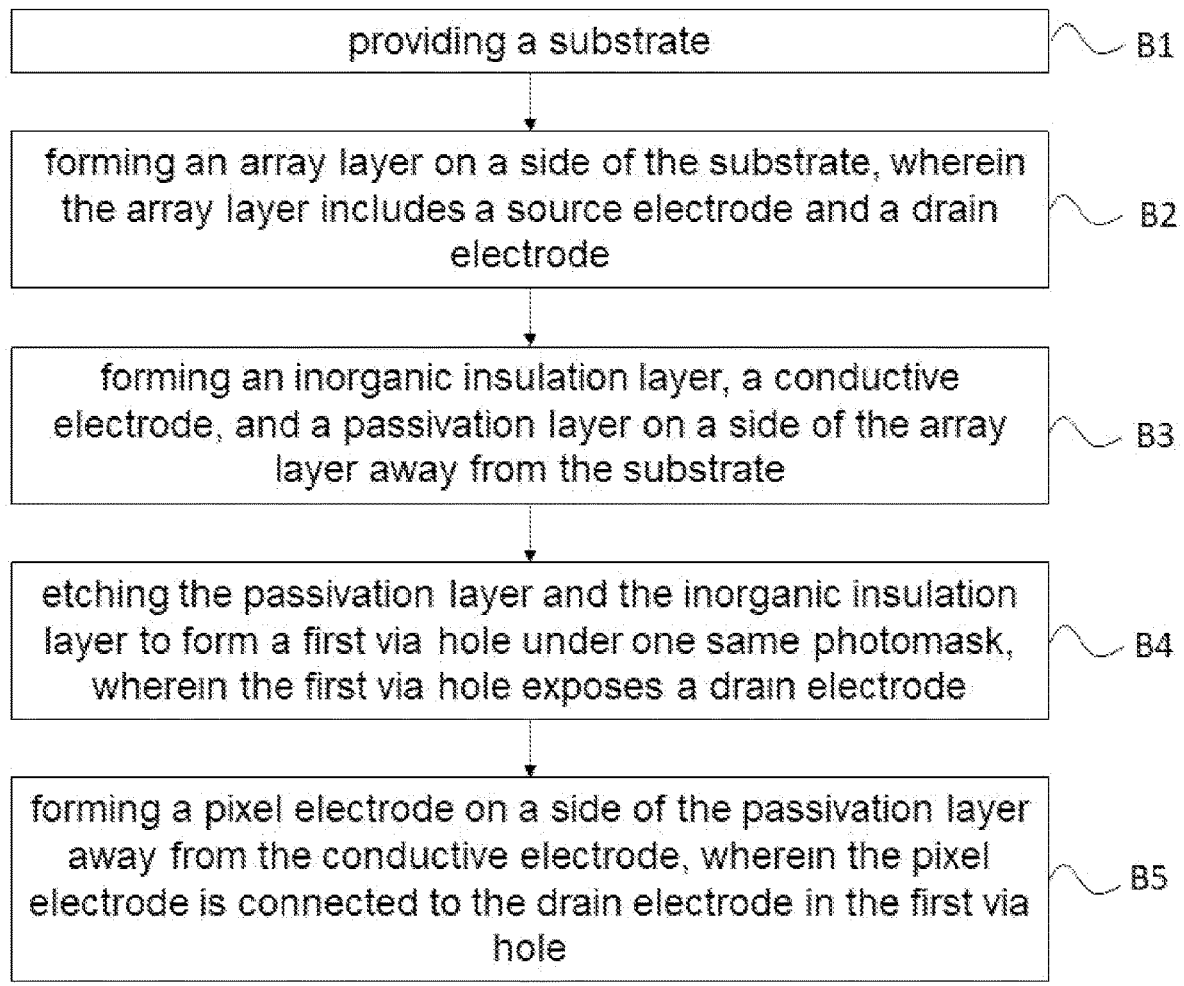
FIG. 6 is a flowchart of a manufacturing method of the array substrate provided by a first example of the present application.

Please refer to FIG. 6, a manufacturing method of the array substrate is provided by a first example of the present application, and the manufacturing method includes following steps:

B1: providing a substrate;

B2: forming an array layer on a side of the substrate, wherein the array layer includes a source electrode and a drain electrode;

B3: forming an inorganic insulation layer, a conductive electrode, and a passivation layer on a side of the array layer away from the substrate;

B4: etching the passivation layer and the inorganic insulation layer to form a first via hole under one same photomask, wherein the first via hole exposes a drain electrode;

B5: forming a pixel electrode on a side of the passivation layer away from the conductive electrode, wherein the pixel electrode is connected to the drain electrode in the first via hole.

Thus, in the manufacturing method of the array substrate provided by the present application, by disposing the inorganic insulation layer between the array layer and the conductive electrode, the inorganic insulation layer is used to replace the planarized organic layer in the traditional array structure. Because the passivation layer is also an inorganic film layer, in manufacturing processes of the array substrates, openings can be defined in the passivation layer and the inorganic insulation layer by one same mask to form a first via hole connecting the pixel electrode and the drain electrode. Therefore, requirement of separately defining an opening for the planarized organic layer in the traditional manufacturing process is omitted, which reduces a number of photomasks used in the manufacturing processes of the array substrate.

Please refer to FIG. 6 and FIG. 7A to FIG. 7L together. The manufacturing method of the array substrate 100 provided by this embodiment is described in detailed as follow.

Figure 7A:
FIG. 7A to FIG. 7L are structural schematic diagrams obtained sequentially at each stage in the manufacturing method of the array substrate provided by the first example of the present application.

B1: providing the substrate, which is illustrated as FIG. 7A.

Wherein, the substrate 10 can be a rigid substrate, such as a glass substrate, or the substrate 10 can also be a flexible substrate, such as a polyimide substrate. A material of the substrate 10 is not specifically limited in the present application.

B2: forming the array layer 12 on a side of the substrate 10, wherein the array layer 12 includes the drain electrode 126.

Figure 7B:
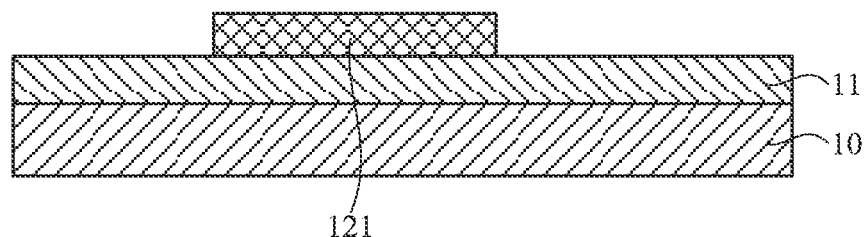

Wherein, the step B2 specifically includes:

B21: forming the buffer layer 11 and the active layer 121 on the side of the substrate 10 in sequence, which is illustrated as FIG. 7B.

First, the buffer layer 11 is formed by using a chemical vapor deposition process. Wherein, the material of the buffer layer 11 can include one or more of silica, silicon nitride, or silicon oxynitride.

Then, low-temperature polycrystalline-silicon is deposited on the buffer layer 11, laser annealing is performed to form an active base layer in an entire surface manner (not shown in the figure). After that, the active layer 121 is formed by performing a patterning process on the active base layer through processes of exposure, development, and etching in sequence. Wherein, a thickness of the active layer 121 ranges from 30 nm to 45 nm.

Figure 7C:
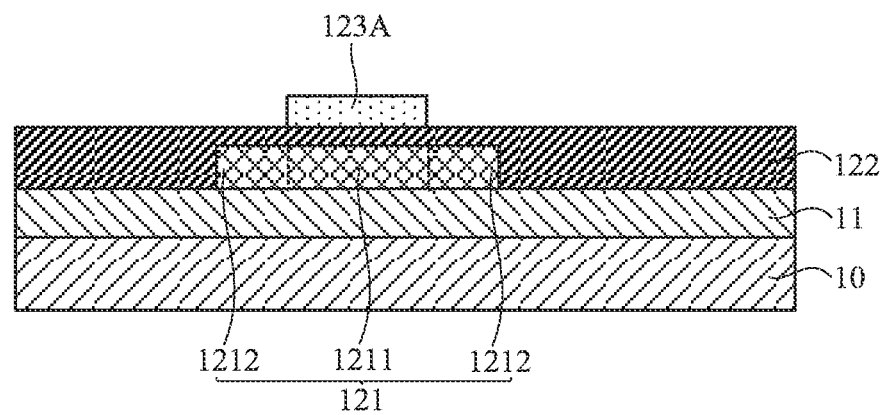

B22: forming the gate insulation layer 122 and a gate pattern 123A, which is illustrated as FIG. 7C.

First, the gate insulation layer 122 is formed by using a chemical vapor deposition process. Wherein, a material of the gate insulation layer 122 can include one or more of silica, silicon nitride, or silicon oxynitride.

Then, a layer of a gate metal layer is formed on the gate insulation layer 122 (not shown in the figure) by using a chemical vapor deposition process. After that, the gate pattern 123A is formed by performing a patterning process on the gate metal layer layer through processes of exposure, development, and etching in sequence. Specifically, a material of the gate electrode 123 can include one or more of copper, aluminum, molybdenum, or titanium.

Wherein, the active layer 121 includes a first region 1211 and a second region 1212 defined on two opposite sides of the first region 1211. The first region 1211 is disposed corresponding to the gate pattern 123A. Specifically, an orthogonal projection of the gate pattern 123A on a plane where the substrate 10 is completely covers an orthogonal projection of the part of the active layer 121 located in the first region 1211 on the plane where the substrate 10 is.

Figure 7D:
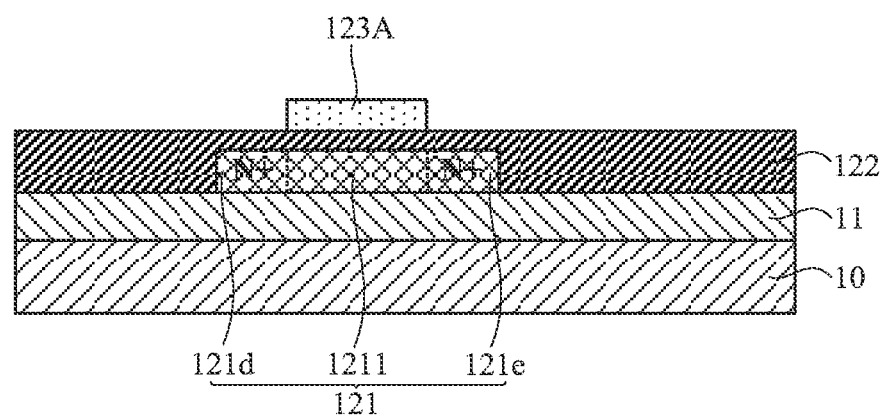

B23: forming the first heavily doped region 121d and the second heavily doped region 121e in the active layer 121, which is illustrated in FIG. 7D.

The gate pattern 123A is used as a mask, and heavy ion doping is performed in a part of the active layer 121 located in the second region 1212 to respectively form the first heavily doped region 121d and the second heavily doped region 121e. Specifically, taking an NMOS LTPS TFT substrate as an example, the heavy ion doping is N-type ion doping, and the doped ions are phosphorus (P) ions or other N-type element ions.

Figure 7E:
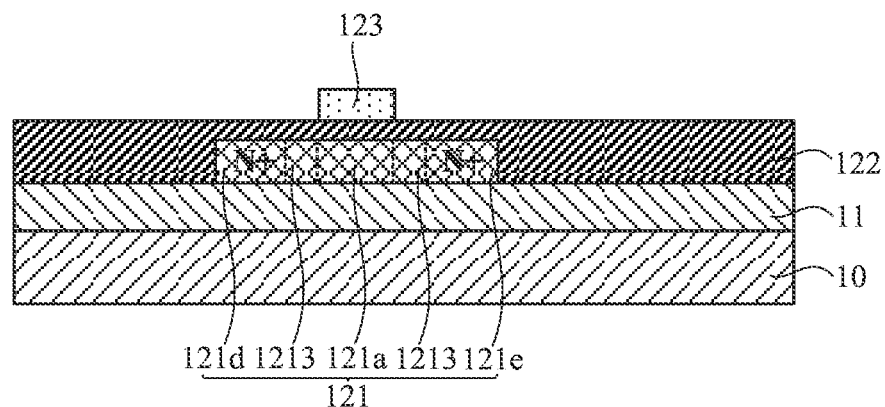

B34: performing an etching process on the gate pattern 123A to form the gate electrode pattern 123, which is illustrated as as FIG. 7E.

Wherein, the gate pattern 123A is patterned to form the gate electrode 123 by using the etching process. A region of the active layer 122 corresponding to the gate electrode 123 is the channel region 121a, i.e., an orthogonal projection of the gate electrode 123 on the plane where the substrate 10 is completely covers an orthogonal projection of the part of the active layer 121 located in the channel region 121a on the plane where the substrate 10 is.

In this embodiment, the width of the channel region 121a ranges from 1.5 μm to 2.5 μm. The active layer 121 further includes third regions 1213 located on two opposite sides of the channel region 121a. The third region 1213 of one side of the channel region 121a is located between the channel region 121a and the first heavily doped region 121d. The third region 1213 of another side of the channel region 121a is located between the channel region 121a and the second heavily doped region 121e.

Figure 7F:
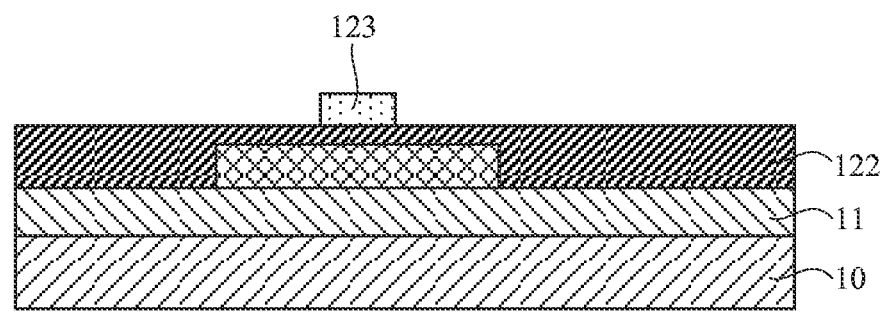

B25: forming the first lightly doped region 121b and the second lightly doped region 121c in the active layer 121, which is illustrated in FIG. 7F.

The gate electrode 123 is used as a mask, and light ion doping is performed on a part of the active layer 121 located in the third region 1213. The third region 1213 on the side of the channel region 121a close to the first heavily doped region 121d is formed into the first lightly doped region 121b. The third region 1213 on the side of the channel region 121a close to the second heavily doped region 1213 is formed into the second lightly doped region 121c. Specifically, taking an NMOS LTPS TFT substrate as an example, the light ion doping is N-type ion doping, and the doped ions are phosphorus (P) ions or other N-type element ions.

Figure 7G:
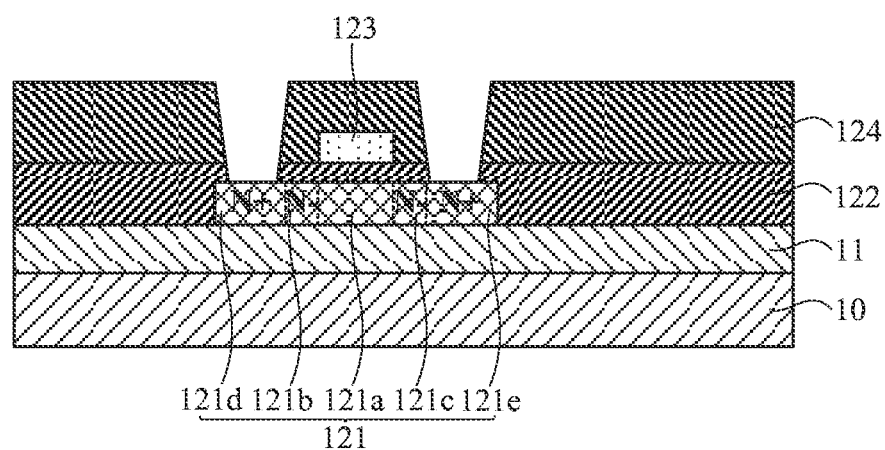

B26: forming the interlayer dielectric layer 124 on the side of the gate electrode 123 away from the gate insulation layer 122, and performing a patterning process on the interlayer dielectric layer 124 to form the first opening (not shown in the figure) exposing the first heavily doped region 121d and the second opening (not shown in the figure) exposing the second heavily doped region 121e, which are illustrated in FIG. 7G.

First, the interlayer dielectric layer 124 is formed by using a chemical vapor deposition process. Wherein, a material of the interlayer dielectric layer 124 can include one or more of silica, silicon nitride, or silicon oxynitride.

Then, the first opening and the second opening are formed by performing the patterning process on the interlayer dielectric layer 124 through processes of exposure, development, and etching.

Figure 7H:
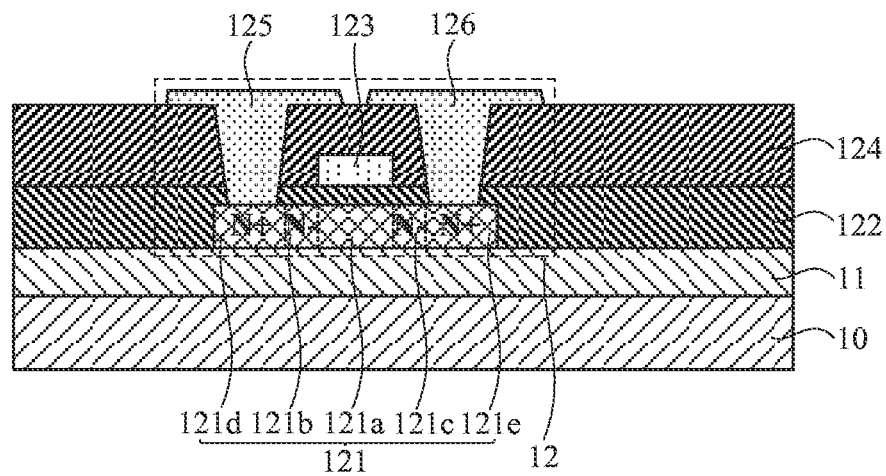

B27: forming the source electrode 125 and the drain electrode 126 on a side of the interlayer dielectric layer 124 away from the gate electrode 123, which is illustrated in FIG. 7H.

First, a source drain metal layer (not shown in the figure) is formed by a physical vapor deposition process. Wherein, a material of the source drain metal layer can include one or more of copper, aluminum, molybdenum, or titanium.

Then, the source electrode 125 and the drain electrode 126 are formed by performing a patterning process on the source drain metal layer through processes of exposure, development, and etching.

In this embodiment, the array layer 12 is composed of the active layer 121, the gate insulation layer 122, the gate electrode 123, the interlayer dielectric layer 124, the source electrode 125, and the drain electrode 126.

B3: forming the inorganic insulation layer 13, the conductive electrode 14, and the passivation layer 15 on a side of the array layer 12 away from the substrate 10.

Figure 7I:
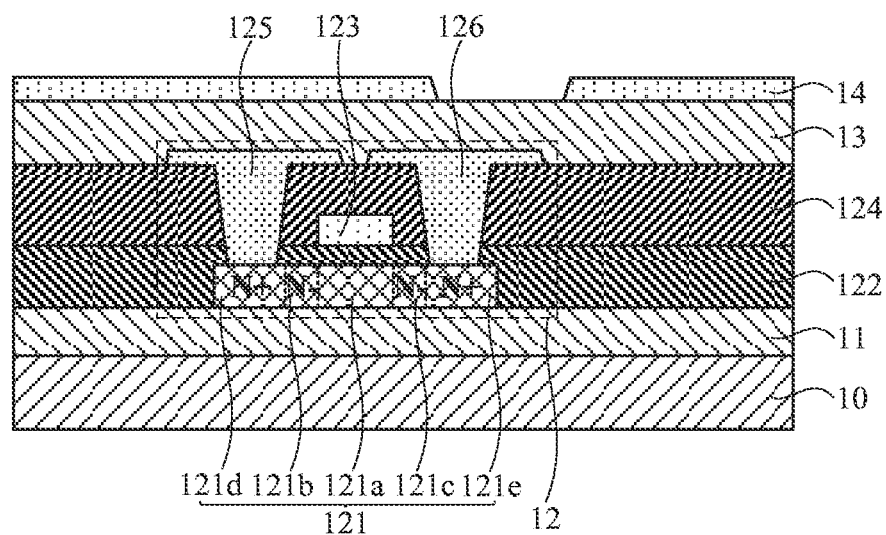

Wherein, the step B3 specifically includes:

B31: forming the inorganic insulation layer 13 and the conductive electrode 14 sequentially on the side of the array layer 12 away from the substrate 10, which is illustrated as in FIG. 7I.

First, the inorganic insulation layer 13 is formed by using a chemical vapor deposition process. Wherein, a material of the inorganic insulation layer 13 can include one or more of silica, silicon nitride, or silicon oxynitride. A thickness of the inorganic insulation layer 13 ranges from 100 nm to 1000 nm. Wherein, the inorganic insulation layer 13 can be a single-layer structure, a double-layer structure, or a multi-layer structure. In this embodiment, the inorganic insulation layer 13 being the single-layer structure is taken as an example for description, but it is not limited to thereto.

Next, a conductive electrode layer of the entire surface is formed on the inorganic insulation layer 13, and the conductive electrode layer is patterned to form the conductive electrode 14 Wherein, an opening (not shown in the figure) corresponding to the drain electrode 123 is formed in the conductive electrode 14. In this embodiment, the conductive electrode 14 can be a common electrode. A material of the conductive electrode 14 can include a transparent conductive material such as indium tin oxide, etc.

Figure 7J:
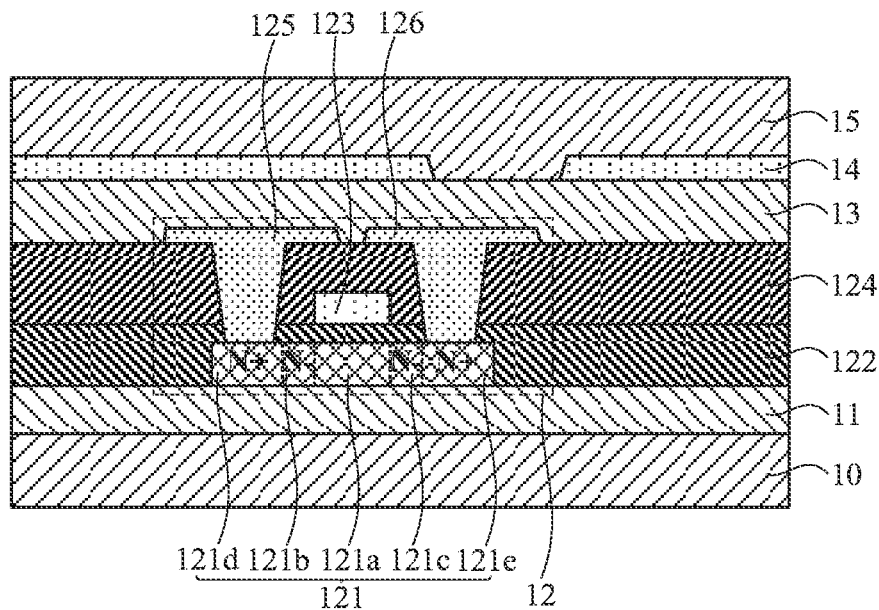

B32: forming the passivation layer 15 on a side of the conductive electrode 14 away from the inorganic insulation layer 13, which is illustrated as FIG. 7J.

Specifically, the passivation layer 15 is formed by using the chemical vapor deposition process. Wherein, the material of the passivation layer 15 can include one or more of silica, silicon nitride, or silicon oxynitride.

Figure 7K:
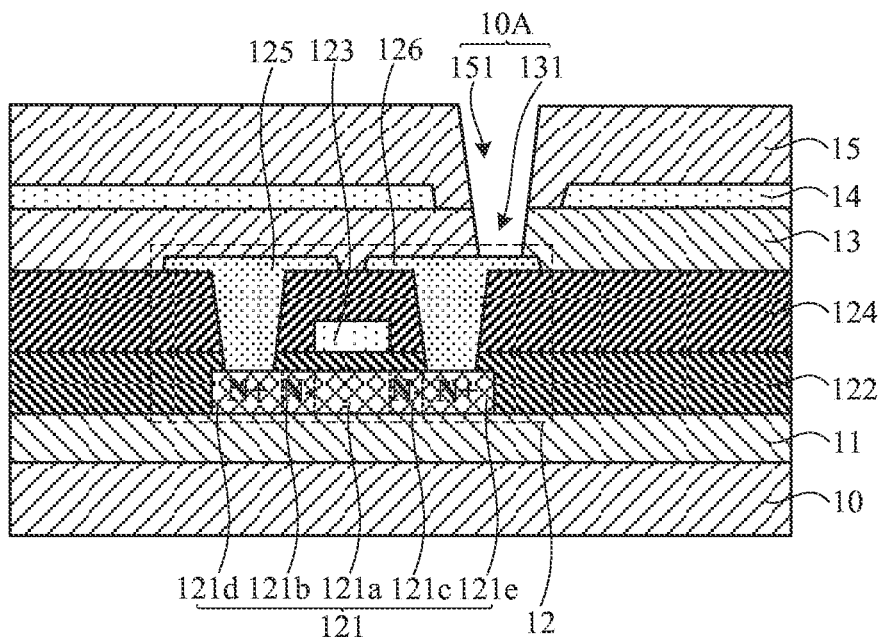

B4: etching the passivation layer 15 and the inorganic insulation layer 13 to form a first via hole 10A under one same photomask, wherein the first via hole 10A exposes the drain electrode 126, which is illustrated as FIG. 7K.

Specifically, under one photomask, the passivation layer 15 and the inorganic insulation layer 13 are etched sequentially through processes of exposure, development, and etching to form a first sub-via hole 131 in the inorganic insulation layer 13 exposing the drain electrode 126, and to form a second sub-via hole 151 communicated with the first sub-via hole 131 in the passivation layer 15. The the first sub-via hole 131 and the second sub-via hole 151 constitutes the first via hole 10A.

Figure 7L:
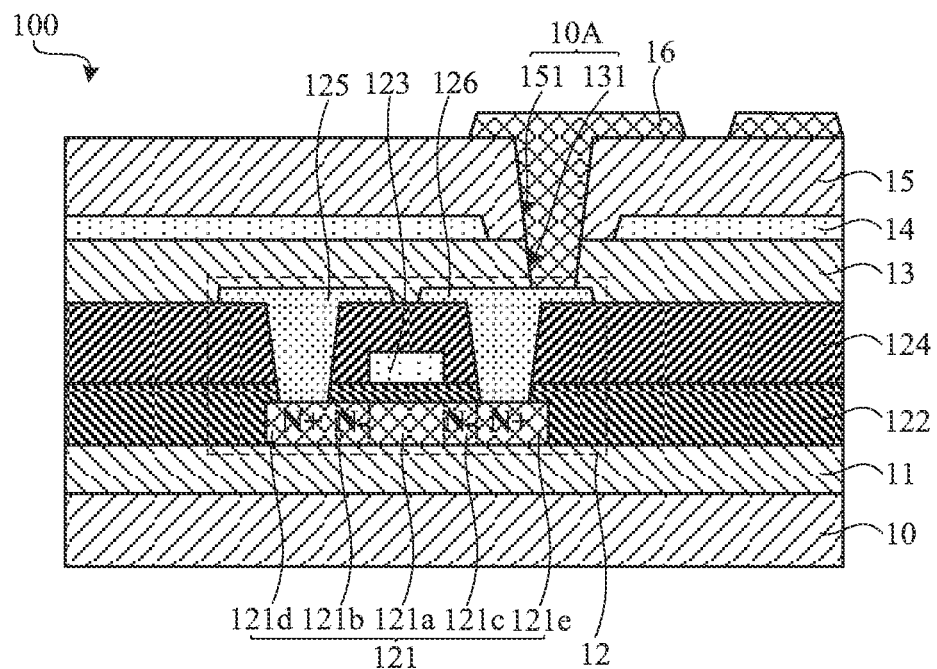

B5: forming the pixel electrode 16 on the side of the passivation layer 15 away from the conductive electrode 14, wherein the pixel electrode 16 is connected to the drain electrode 126 in the first via hole 10A, which is illustrated as FIG. 7L.

Specifically, a physical vapor deposition process is used to form a conductive layer (not shown in the figure), and the conductive layer is patterned through processes of exposure, development, and etching in sequence to form the pixel electrode 16.

Thus, by disposing the inorganic insulation layer 13 between the array layer 12 and the conductive electrode 14, the inorganic insulation layer 13 is used to replace the planarized organic layer in the traditional array structure. Because the passivation layer 15 is also an inorganic film layer, openings can be defined in the passivation layer 15 and the inorganic insulation layer 13 by one same mask to form the first via hole 10A connecting the pixel electrode 16 and the drain electrode 126. Therefore, requirement of separately defining an opening for the planarized organic layer in the traditional manufacturing process is omitted, which reduces a number of photomasks used in the manufacturing processes of the array substrate 100.

It should be noted that the array substrate 100 provided by the first embodiment of the present application can be manufactured by adopting the manufacturing method of the array substrate 100 provided by the aforesaid embodiment.

A manufacturing method of the array substrate 100 is provided by a second example of the present application. In the second example, when the array substrate 100 has a touch function, the conductive electrode 14 can be multiplexed as a touch electrode. Please refer to FIG. 8A to FIG. 8D. The difference between the manufacturing method provided by the second example and the first example is in the following steps.

Figure 8A:
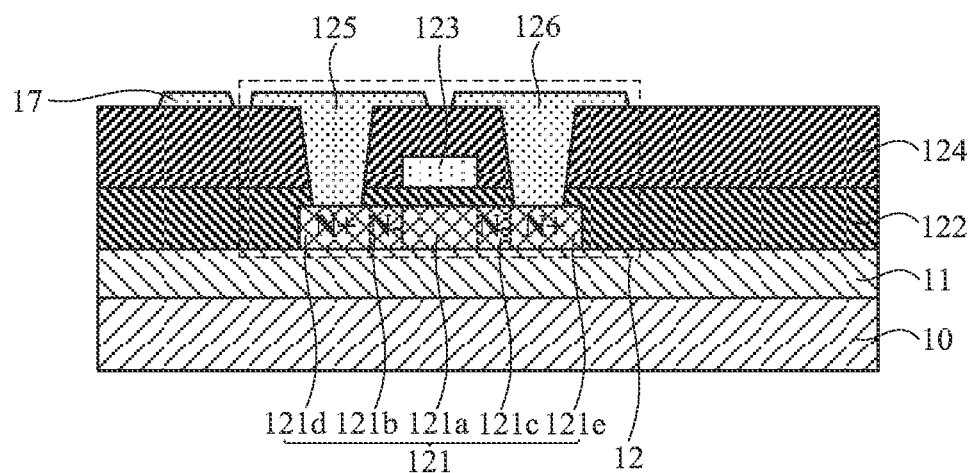
FIG. 8A to FIG. 8D are structural schematic diagrams obtained sequentially in a part of stages in the manufacturing method of the array substrate provided by a second example of the present application.

In the step B27, a step of forming the touch wiring 17 is further included, which is illustrated as FIG. 8A. Wherein, the touch wiring 17 and the drain electrode 126 are disposed on a same layer and are spaced apart with each other. Specifically, the touch wiring 17 is disposed on a side of the source electrode 125 away from the drain electrode 126. In this embodiment, the touch wiring 17, the source electrode 125, and the drain electrode 126 can be obtained by one same photomask.

Figure 8B:
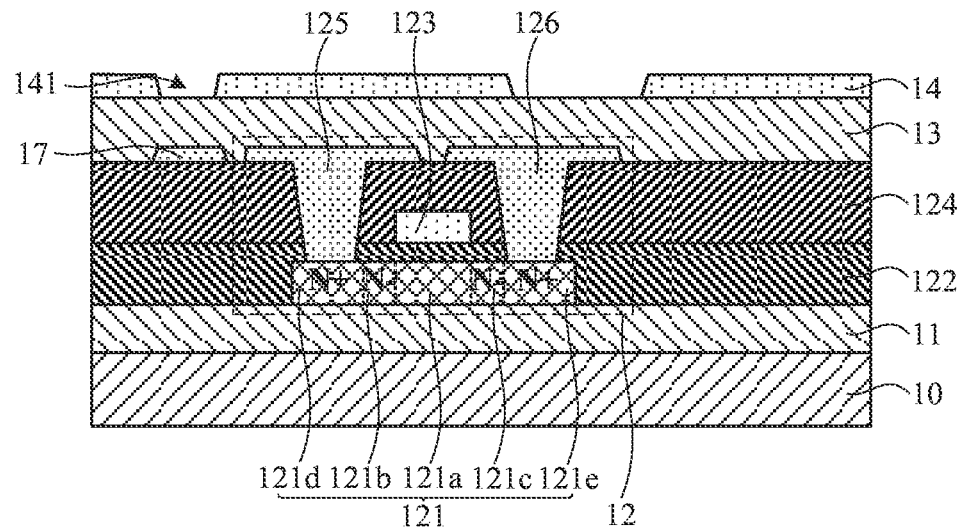

In the step B31, forming the opening 141 in the conductive electrode 14 is further included as illustrated in FIG. 8B. Wherein, the opening 141 is disposed corresponding to the touch wiring 17.

Figure 8C:
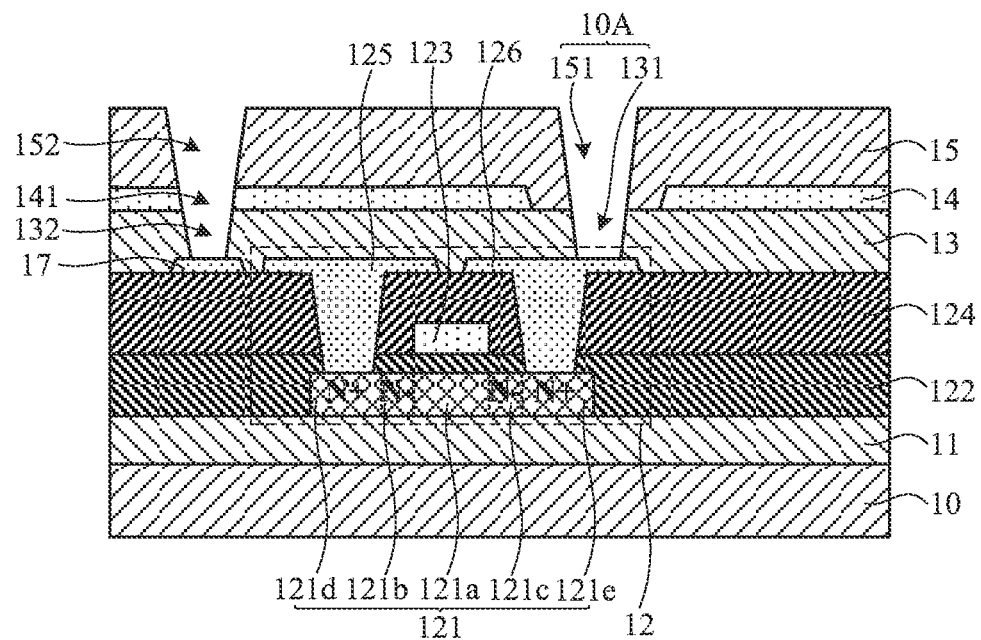

The step B4 includes: under one same photomask, etching the passivation layer 15, a region of the inorganic insulation layer 13 corresponding to the drain electrode 126, and a region of the inorganic insulation layer 13 corresponding to the touch wiring 17 respectively to form the first via hole 10A, the second via hole 132, and the third via hole 152. The second via hole 132 penetrates the inorganic insulation layer 13 and exposes the touch wiring 17, and the third via hole 152 penetrates the passivation layer 15 and communicates with the opening 141 and the second via hole 132 as illustrated in FIG. 8C.

Figure 8D:
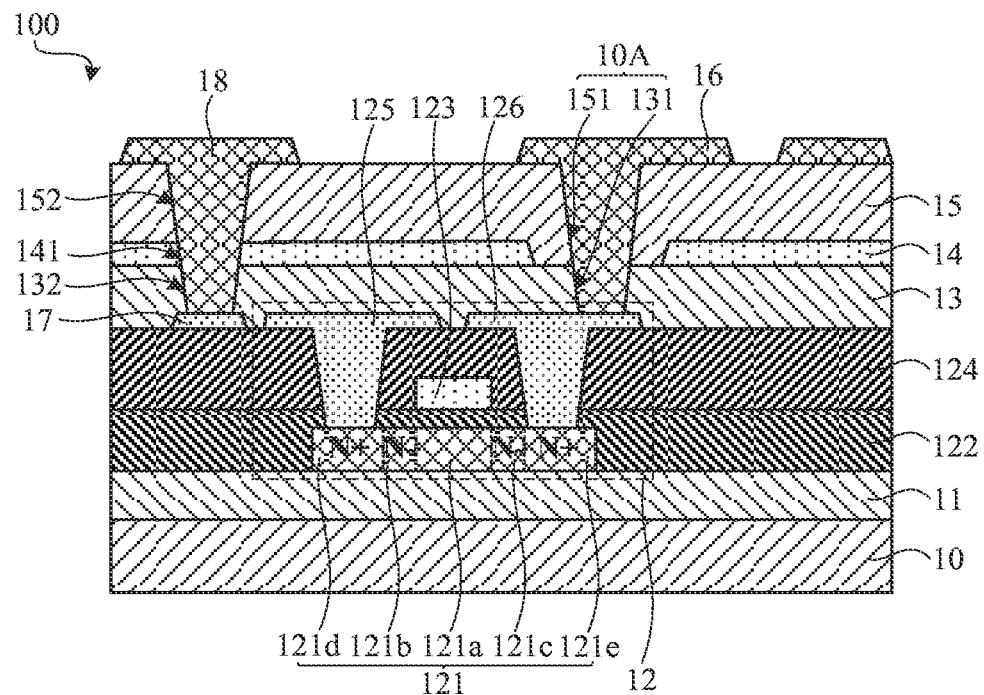

In the step B5, a step of forming the connection electrode 18 is further included, which is illustrated as FIG. 8D. Specifically, when the conductive layer is etched, the pixel electrode 16 and the connection electrodes 18 insulated from each other are formed at the same time. The connection electrode 18 is filled in the second via hole 132, the opening 141, and the third via hole 152, and contacts to a lateral wall of the opening 141. The touch electrode is connected to the touch wiring 17 through the connection electrode 18.

Figure 9A:
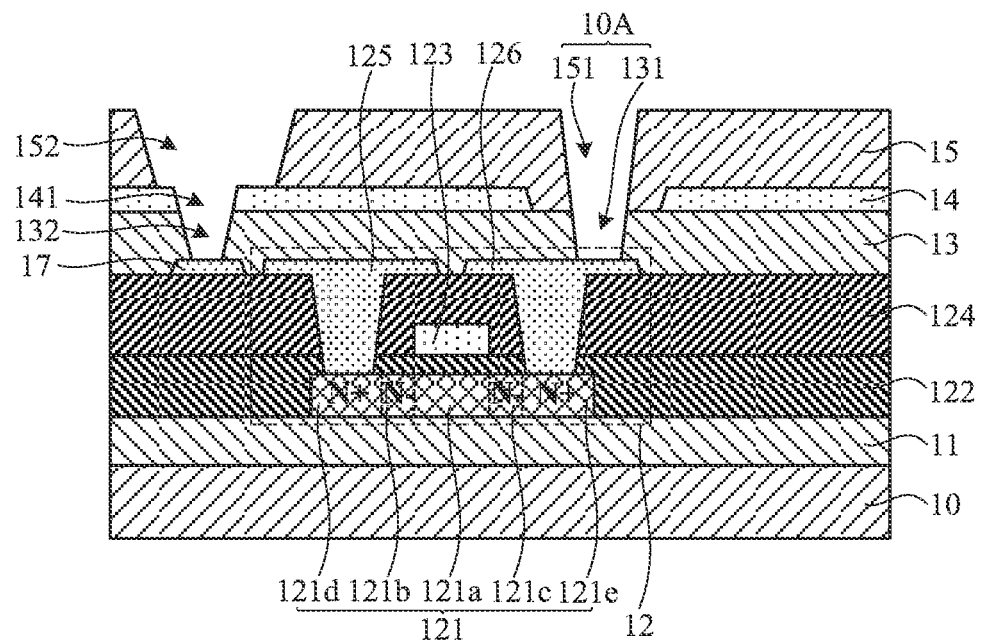
FIG. 9A to FIG. 9B are structural schematic diagrams obtained sequentially in a part of stages in the manufacturing method of the array substrate provided by a third example of the present application.
Figure 9B:
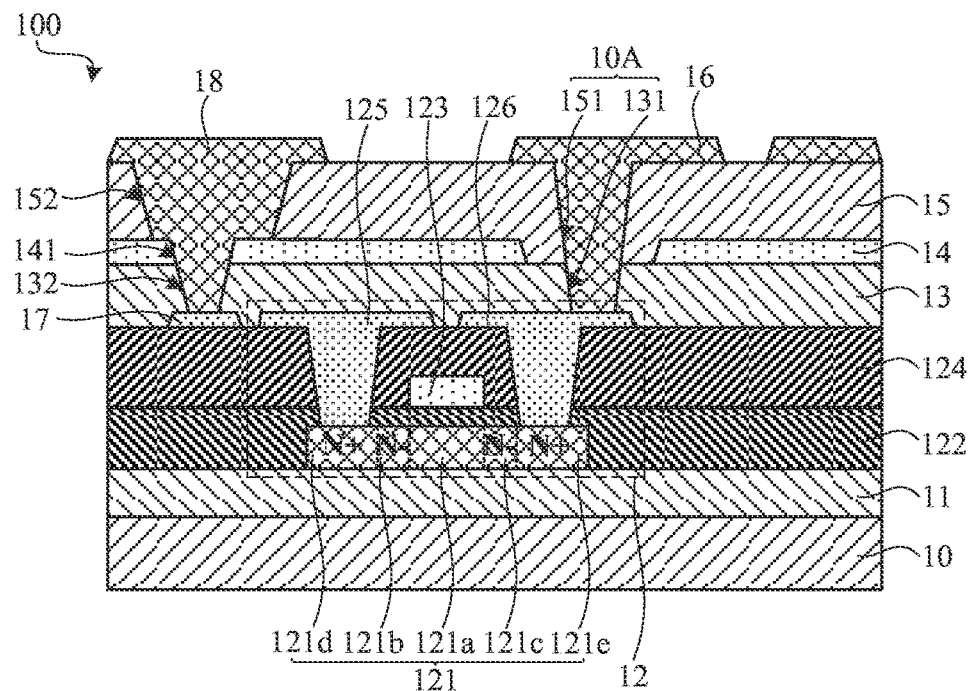

A third example of the present application provides a manufacturing method of the array substrate 100. Please refer to FIG. 9A to FIG. 9B. The difference between the manufacturing method provided by the third example and the second example is in the following steps.

In the step B4, the third via hole 152 exposes a surface of the touch electrode away from the substrate 10. Specifically, during etching, the pore size of the third via hole 152 is greater than the pore size of the opening 14 to expose the surface of the touch electrode.

In the step B5, the connection electrode 18 respectively contacts to the lateral wall of the opening 141 and a surface of the touch electrode away from the substrate 10.

The fourth example of the present application provides a manufacturing method of the array substrate 100. Please refer to FIG. 10A to FIG. 10B. The difference between the manufacturing method provided by the fourth example and the third example is in the following steps.

Figure 10A:
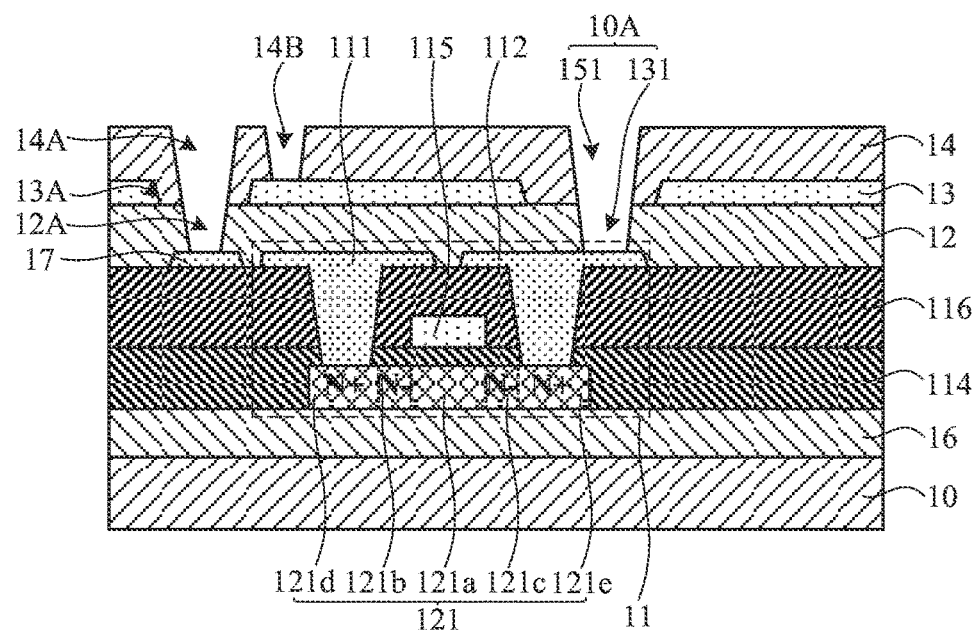
FIG. 10A to FIG. 10B are structural schematic diagrams obtained sequentially in a part of stages in the manufacturing method of the array substrate provided by a fourth example of the present application.

The step B4 includes: under one same photomask, etching the passivation layer 15, a region of the inorganic insulation layer 13 corresponding to the drain electrode 126, and a region of the inorganic insulation layer 13 corresponding to the touch wiring 17 respectively to form the first via hole 10A, the second via hole 132, the third via hole 152, and the fourth via hole 153. The second via hole 132 penetrates the inorganic insulation layer 13 and exposes the touch wiring 17. The third via hole 152 penetrates the passivation layer 15 and communicates with the opening 141 and the second via hole 132. A pore size of the second via hole 132 is less than a pore size of the opening 141. The fourth via hole 153 and the third via hole 152 are spaced apart with each other. The fourth via hole 153 penetrates the passivation layer 15 and exposes the touch electrode as illustrated in FIG. 10A.

Figure 10B:
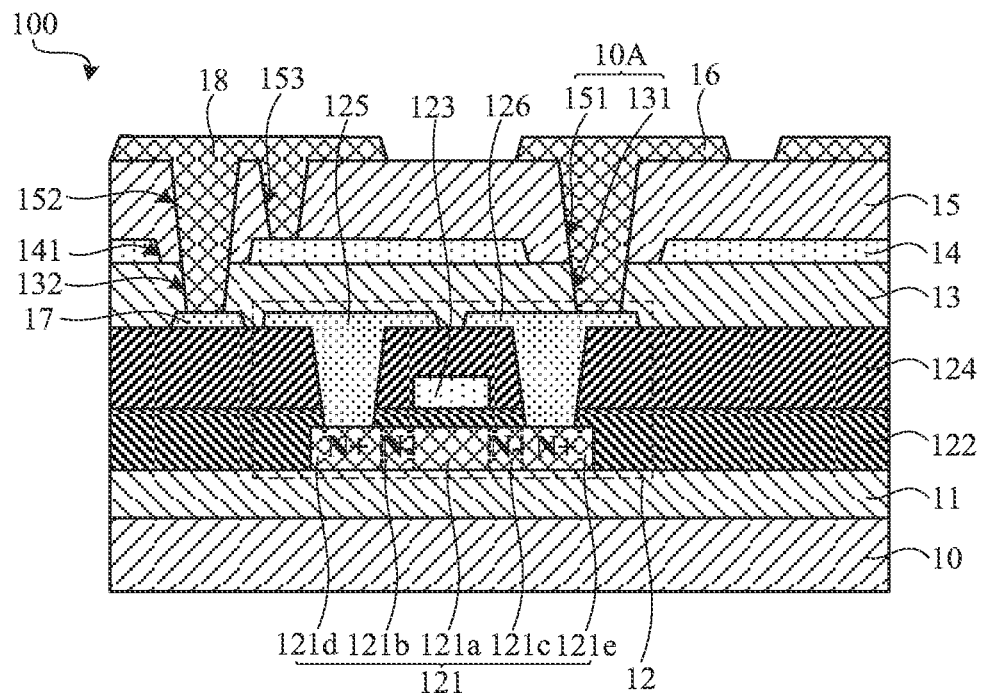

In the step B5, a step of forming the connection electrode 18 is further included, which is illustrated as FIG. 10B. Specifically, when the conductive layer is etched, the pixel electrode 16 and the connection electrodes 18 insulated from each other are formed at the same time. The connection electrode 18 is filled in the second via hole 132, the third via hole 152, the fourth via hole 153, and a part of the opening 141. A part of the connection electrode 18 located in the opening 141 is insulated from the touch electrode. The touch electrode is electrically connected to the touch wiring 17 through the connection electrode 18.

Figure 11:
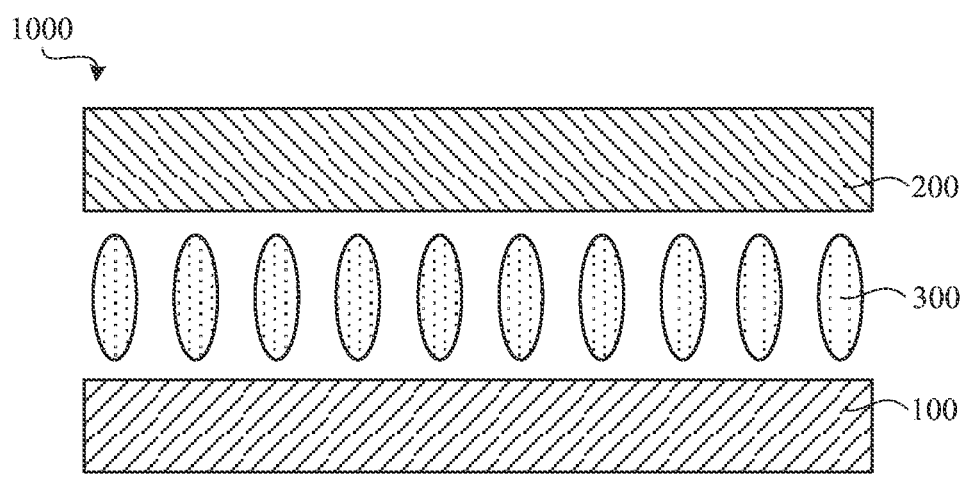
FIG. 11 is a structural schematic diagram of a display panel provided by the present application.

Please refer to FIG. 11. The present application further provides a display device 1000. The display panel 1000 includes an array substrate 100 and a color film substrate 200 disposed opposite to each other, and a liquid crystal layer 300 disposed between the array substrate 100 and the color film substrate 200. The array substrate 100 can be the substrate 100 of any aforesaid embodiment. Specific structures of the array substrate 100 can refer to the description of the aforesaid embodiments, and redundant description will not be mentioned herein.

The array substrate and the display panel provided by the embodiments of the present application are described in detail above. This article uses specific cases for describing the principles and the embodiments of the present application, and the description of the embodiments mentioned above is only for helping to understand the method and the core idea of the present application. Meanwhile, for those skilled in the art, will have various changes in specific embodiments and application scopes according to the idea of the present application. In summary, the content of the specification should not be understood as limit to the present application.

What is claimed is:

1. An array substrate comprising:
    a substrate;
    an array layer disposed on a side of the substrate, wherein the array layer comprises a source electrode and a drain electrode;
    an inorganic insulation layer disposed on a side of the array layer away from the substrate;
    a conductive electrode disposed on a side of the inorganic insulation layer away from the array layer;
    a passivation layer disposed on a side of the conductive electrode away from the inorganic insulation layer; and
    a pixel electrode disposed on a side of the passivation layer away from the conductive electrode;
    wherein a first via hole is defined in the array substrate, the first via hole penetrates the passivation layer and the inorganic insulation layer and exposes the drain electrode, the pixel electrode is connected to the drain electrode in the first via hole; and
    the conductive electrode is multiplexed as a touch electrode; the array substrate further comprises a touch wiring disposed in a same layer with the drain electrode and spaced apart from the drain electrode, a connection electrode is located on a side of the passivation layer away from the conductive electrode, and the touch electrode is connected to the touch wiring through the connection electrode.

2. The array substrate as claimed in claim 1, wherein the first via hole comprises a first sub-via hole and a second sub-via hole communicated with the first sub-via hole, the first sub-via hole is located in the inorganic insulation layer and exposes the drain electrode, the second sub-via hole is located in the passivation layer, and the pixel electrode is in contact with a hole wall of the first sub-via hole and a hole wall of the second sub-via hole respectively.

3. The array substrate as claimed in claim 1, wherein an opening is defined in the touch electrode, the opening is disposed corresponding to the touch wiring, a second via hole is defined in the inorganic insulation layer, the second via hole exposes the touch wiring, a third via hole is defined in the passivation layer, the third via hole communicates with the opening and the second via hole, and the connection electrode is filled in the second via hole, the opening, and the third via hole and is in contact with a lateral wall of the opening.

4. The array substrate as claimed in claim 3, wherein the third via hole exposes a surface of the touch electrode away from the substrate.

5. The array substrate as claimed in claim 1, wherein an opening is defined in the touch electrode, the opening is disposed corresponding to the touch wiring, the passivation layer is filled in the opening, a second via hole is defined in the inorganic insulation layer, a pore size of the second via hole is less than a pore size of the opening, the second via hole exposes the touch wiring, a third via hole and a fourth via hole spaced apart from each other are defined in the passivation layer, the third via hole communicates with the opening and the second via hole, and the fourth via hole exposes the touch electrode, the connection electrode is filled in the second via hole, the third via hole, the fourth via hole, and a part of the opening, and a part of the connection electrode located in the opening is insulated from the touch electrode.

6. The array substrate as claimed in claim 3, wherein the second via hole and the third via hole are formed under one same photomask.

7. The array substrate as claimed in claim 1, wherein the connection electrode and the pixel electrode are in a same layer and are insulated from each other.

8. The array substrate as claimed in claim 1, wherein the array layer comprises:
    an active layer disposed on the side of the substrate, wherein the active layer has a channel region;
    a gate insulation layer disposed on a side of the active layer away from the substrate;
    a gate electrode disposed on a side of the gate insulation layer away from the active layer; and
    an interlayer dielectric layer disposed on a side of the gate electrode away from the gate insulation layer, wherein the interlayer dielectric layer is located on a side of the drain electrode away from the inorganic insulation layer, and
    wherein a thickness of the active layer ranges from 30 nm to 45 nm, and a width of the channel region ranges from 1.5 μm to 2.5 μm.

9. The array substrate, as claimed in claim 1, wherein the first via hole comprises a first sub-via hole and a second sub-via hole communicated with the first sub-via hole, the first sub-via hole is located in the inorganic insulation layer and exposes the drain electrode, the second sub-via hole is located in the passivation layer, the pixel electrode is in contact with a hole wall of the first sub-via hole and a hole wall of the second sub-via hole respectively, and the first sub-via hole and the second sub-via hole are formed under one same photomask.

10. The array substrate as claimed in claim 1, wherein the conductive electrode is multiplexed as the touch electrode in response to the array substrate performing a touch operation; and
    the conductive electrode is multiplexed as a common electrode in response to the array substrate not performing the touch operation, and the common electrode and the pixel electrode form a storage capacitor.

11. The array substrate as claimed in claim 1, wherein an opening is defined in the touch electrode, the opening is disposed corresponding to the touch wiring; a second via hole is defined in the inorganic insulation layer, and the second via hole exposes the touch wiring; a third via hole is defined in the passivation layer, and the third via hole communicates with the opening and the second via hole in a thickness direction of the array substrate; and the connection electrode is filled in the second via hole, the opening, and the third via hole, and a side surface of a part of the connection electrode located in the opening is in direct contact with a lateral wall of the opening in a circumferential direction of the opening.

12. The array substrate as claimed in claim 1, wherein an opening is defined in the touch electrode, the opening is disposed corresponding to the touch wiring; a second via hole is defined in the inorganic insulation layer, and the second via hole exposes the touch wiring; a third via hole is defined in the passivation layer, and the third via hole communicates with the opening and the second via hole in a thickness direction of the array substrate; and the connection electrode is filled in the second via hole, the opening, and the third via hole, and a lateral wall of the opening is flush with a hole wall of the second via hole in a cross-sectional view of the array substrate.

13. The array substrate as claimed in claim 12, wherein the lateral wall of the opening is flush with the hole wall of the second via hole and a hole wall of the third via hole in the cross-sectional view of the array substrate.

14. The array substrate as claimed in claim 1, wherein a pore size of the third via hole is greater than a pore size of the opening, and the third via hole exposes an upper surface of the touch electrode away from the substrate.

15. The array substrate as claimed in claim 1, wherein a hole wall of the third via hole, a part of a bottom wall of the third via hole, and the lateral wall of the opening are sequentially connected to form a stepped structure, and the connection electrode is in direct contact with the stepped structure.

16. A display panel, wherein the display panel comprises an array substrate and a color film substrate disposed opposite to each other, and a liquid crystal layer disposed between the array substrate and the color film substrate, the array substrate comprises:
 a substrate;
 an array layer disposed on a side of the substrate, wherein the array layer comprises a source electrode and a drain electrode;
 an inorganic insulation layer disposed on a side of the array layer away from the substrate;
 a conductive electrode disposed on a side of the inorganic insulation layer away from the array layer;
 a passivation layer disposed on a side of the conductive electrode away from the inorganic insulation layer; and
 a pixel electrode disposed on a side of the passivation layer away from the conductive electrode;
 wherein a first via hole is defined in the array substrate, the first via hole penetrates the passivation layer and the inorganic insulation layer and exposes the drain electrode, the pixel electrode is connected to the drain electrode in the first via hole; and
 the conductive electrode is multiplexed as a touch electrode; the array substrate further comprises a touch wiring disposed in a same layer with the drain electrode and spaced apart from the drain electrode, a connection electrode is located on a side of the passivation layer away from the conductive electrode, and the touch electrode is connected to the touch wiring through the connection electrode.

17. The display panel as claimed in claim 16, wherein the first via hole comprises a first sub-via hole and a second sub-via hole communicated with the first sub-via hole, the first sub-via hole is located in the inorganic insulation layer and exposes the drain electrode, the second sub-via hole is located in the passivation layer, the pixel electrode is in contact with a hole wall of the first sub-via hole and a hole wall of the second sub-via hole respectively.

18. The display panel as claimed in claim 16, wherein an opening is defined in the touch electrode, the opening is disposed corresponding to the touch wiring, a second via hole is defined in the inorganic insulation layer, the second via hole exposes the touch wiring, a third via hole is defined in the passivation layer, the third via hole communicates with the opening and the second via hole, and the connection electrode is filled in the second via hole, the opening, and the third via hole and is in contact with a lateral wall of the opening.

19. The display panel as claimed in claim 18, wherein the third via hole exposes a surface of the touch electrode away from the substrate.

20. The display panel as claimed in claim 16, wherein an opening is defined in the touch electrode, the opening is disposed corresponding to the touch wiring, the passivation layer is filled in the opening, a second via hole is defined in the inorganic insulation layer, a pore size of the second via hole is less than a pore size of the opening, the second via hole exposes the touch wiring, a third via hole and a fourth via hole spaced apart from each other are defined in the passivation layer, the third via hole communicates with the opening and the second via hole, and the fourth via hole exposes the touch electrode, the connection electrode is filled in the second via hole, the third via hole, the fourth via hole, and a part of the opening, and a part of the connection electrode located in the opening is insulated from the touch electrode.

* * * * *